United States Patent
Forrest et al.

(10) Patent No.: US 12,048,169 B2
(45) Date of Patent: Jul. 23, 2024

(54) HIGH EFFICIENCY, COLOR NEUTRAL, SEMI-TRANSPARENT ORGANIC PHOTOVOLTAICS FOR ENERGY HARVESTING WINDOWS

(71) Applicant: The Regents of the University of Michigan, Ann Arbor, MI (US)

(72) Inventors: Stephen R. Forrest, Ann Arbor, MI (US); Hafiz K. M. Sheriff, Jr., Ann Arbor, MI (US)

(73) Assignee: The Regents of the University of Michigan

( * ) Notice: Subject to any disclaimer, the term of this patent is extended or adjusted under 35 U.S.C. 154(b) by 0 days.

(21) Appl. No.: 17/932,577

(22) Filed: Sep. 15, 2022

(65) Prior Publication Data

US 2023/0088880 A1    Mar. 23, 2023

Related U.S. Application Data

(60) Provisional application No. 63/247,209, filed on Sep. 22, 2021.

(51) Int. Cl.
*H10K 30/87* (2023.01)
*H10K 30/30* (2023.01)
*H10K 30/82* (2023.01)

(52) U.S. Cl.
CPC ............ *H10K 30/87* (2023.02); *H10K 30/30* (2023.02); *H10K 30/82* (2023.02)

(58) Field of Classification Search
CPC ......... H10K 30/87; H10K 30/30; H10K 30/82
See application file for complete search history.

(56) References Cited

U.S. PATENT DOCUMENTS

| 6,013,982 A | 1/2000 | Thompson |
| 6,087,196 A | 7/2000 | Sturm |

(Continued)

FOREIGN PATENT DOCUMENTS

| WO | 2008057394 | 5/2008 |
| WO | 2010011390 | 1/2010 |

OTHER PUBLICATIONS

Bailey-Salzman, R. F.; Rand, B. P.; Forrest, S. R. Semitransparent organic photovoltaic cells. Appl. Phys. Lett. 2006, 88, 233502. 4 pages.

(Continued)

*Primary Examiner* — Golam Mowla
(74) *Attorney, Agent, or Firm* — Riverside Law LLP

(57) ABSTRACT

An organic photovoltaic device comprises a first electrode, at least one organic heterojunction layer positioned over the first electrode, a second electrode positioned over the organic heterojunction layer, and a thin film stack positioned over the second electrode, comprising a plurality of sublayers of a first dielectric material alternating with a plurality of sublayers of a second dielectric material, wherein at least one of the plurality of sublayers of the first dielectric material has a thickness that is different from another of the plurality of sublayers of the first dielectric material, wherein the organic photovoltaic device has a mean transmittance of between 10% and 100% for light between 420 nm and 670 nm, with a variance of ±10%, and wherein an index contrast between the sublayers in the thin film stack is at least 0.1. A method of fabricating an organic photovoltaic device is also disclosed.

20 Claims, 12 Drawing Sheets

(56) References Cited

U.S. PATENT DOCUMENTS

| | | | |
|---|---|---|---|
| 6,294,398 B1 | 9/2001 | Kim | |
| 6,337,102 B1 | 1/2002 | Forrest | |
| 6,468,819 B1 | 10/2002 | Kim | |
| 7,431,968 B1 | 10/2008 | Shtein | |
| 7,968,146 B2 | 6/2011 | Wagner | |
| 2011/0132449 A1* | 6/2011 | Ramadas | B82Y 30/00 428/419 |
| 2020/0295286 A1* | 9/2020 | Forrest | H10K 30/81 |

OTHER PUBLICATIONS

Beasley, D., Bull, D. R. & Martin, R. R. An overview of genetic algorithms☐: Part 1, fundamentals. Univ. Comput. 2, 1-16 (1993).

Betancur, R.; Romero-Gomez, P.; Martinez-Otero, A.; Elias, X.; Maymo, M.; Martorell, J. Transparent polymer solar cells employing a layered light-trapping architecture. Nat Photon 2013, 7, 995-1000.

Colsmann, A., Puetz, A., Bauer, A., Hanisch, J., Ahlswede, E. & Lemmer, U. Efficient semi-transparent organic solar cells with good transparency color perception and rendering properties. Adv. Energy Mater. 1, 599-603 (2011).

Cui, Y., Yang, C., Yao, H., Zhu, J., Wang, Y., Jia, G., Gao, F. & Hou, J. Efficient Semitransparent Organic Solar Cells with Tunable Color enabled by an Ultralow-Bandgap Nonfullerene Acceptor. Adv. Mater. 29, 1-7 (2017).

Guo, F., Chen, S., Chen, Z., Luo, H., Gao, Y., Przybilla, T., Spiecker, E., Osvet, A., Forberich, K. & Brabec, C. J. Printed Smart Photovoltaic Window Integrated with an Energy-Saving Thermochromic Layer. Adv. Opt. Mater. 3, 1524-1529 (2015).

Heavens, O. S. & Singer, S. F. Optical Properties of Thin Solid Films. Phys. Today (1956). doi: 10.1063/1.3059910. 3 pages.

Kumar, M., Husain, M., Upreti, N. & Gupta, D. Genetic Algorithm: Review and Application. SSRN Electron. J. 2, 451-454 (2020).

Li, et al., "High Efficiency Near-Infrared and Semitransparent Non-Fullerene Acceptor Organic Photovoltaic Cells", J. Am. Chem. Soc., 2017, 139, 17114-17119.

Li, Y., Ji, C., Qu, Y., Huang, X., Hou, S., Li, C., Liao, L., Guo, L. J. & Forrest, S.R. Enhanced Light Utilization in Semitransparent Organic Photovoltaics Using an Optical Outcoupling Architecture. Adv. Mater. 31, 1-8 (2019).

Pettersson, L. A. A., Roman, L. S. & Inganas, O. Modeling photocurrent action spectra of photovoltaic devices based on organic thin films. J. Appl. Phys. 86, 487-496 (1999).

Peumans, P., Yakimov, A. and Forrest, S.R., "Small molecular weight organic thin-film photodetectors and solar cells," Journal of Applied Physics, vol. 93, No. 7, pp. 3693-3723, 2003.

Rabinovitch, K. & Toker, G. Genetic algorithm and thin-film design. Opt. Thin Film. IV New Dev. 2262, 163-174 (1994).

Sheriff, H. K. M., Li, Y., Qu, B. & Forrest, S. R. Aperiodic optical coatings for neutral-color semi-transparent organic photovoltaics. Appl. Phys. Lett. 118, (2021).

Troparevsky, M. C., Sabau, A. S., Lupini, A. R. & Zhang, Z. Transfer-matrix formalism for the calculation of optical response in multilayer systems: from coherent to incoherent interference. Opt. Express 18, 24715 (2010). 7 pages.

Wang, W., Yan, C., Lau, T., Wang, J., Liu, K., Fan, Y., Lu, X. & Zhan, X. Fused Hexacyclic Nonfullerene Acceptor with Strong Near-Infrared Absorption for Semitransparent Organic Solar Cells with 9.77% Efficiency. Adv. Mater. 29, 1-7 (2017).

* cited by examiner

HIGH EFFICIENCY, COLOR NEUTRAL, SEMI-TRANSPARENT ORGANIC PHOTOVOLTAICS FOR ENERGY HARVESTING WINDOWS

CROSS-REFERENCE TO RELATED APPLICATIONS

This application claims priority to U.S. provisional application No. 63/247,209 filed on Sep. 22, 2021, incorporated herein by reference in its entirety.

STATEMENT REGARDING FEDERALLY SPONSORED RESEARCH OR DEVELOPMENT

This invention was made with government support under DE-EE0008561 awarded by the U.S. Department of Energy. The government has certain rights in the invention.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Photosensitive optoelectronic devices convert electromagnetic radiation into electricity. Solar cells, also called photovoltaic (PV) devices or cells, are a type of photosensitive optoelectronic device that is specifically used to generate electrical power. PV devices, which may generate electrical energy from light sources other than sunlight, may be used to drive power consuming loads to provide, for example, lighting, heating, or to power electronic circuitry or devices such as calculators, radios, computers or remote monitoring or communications equipment. These power generation applications may involve the charging of batteries or other energy storage devices so that operation may continue when direct illumination from the sun or other light sources is not available, or to balance the power output of the PV device with the specific applications requirements.

Traditionally, photosensitive optoelectronic devices have been constructed of a number of inorganic semiconductors, e.g., crystalline, polycrystalline and amorphous silicon, gallium arsenide, cadmium telluride, and others.

More recent efforts have focused on the use of organic photovoltaic (OPV) cells to achieve acceptable photovoltaic conversion efficiencies with economical production costs. OPVs offer a low-cost, light-weight, and mechanically flexible route to solar energy conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers or subcells.

In addition to the pursuit of high device efficiency, OPVs have unique advantages, such as the application of semi-transparent solar cells for use in building integrated photovoltaics (BIPV). Considering the vast surface areas of windows and facades in modern urban environments, developing semi-transparent solar cells with both high efficiency and transmittance has become increasingly important.

The current need to reduce $CO_2$ emission and halt climate change demands the migration from more traditional sources of energy, such as fossil fuels, to cleaner ones. Solar energy is one of such clean energy that has become a ubiquitous alternative in recent years. Surface area coverage and point-of-harvesting-to-point-of-usage distance are two challenges to the implementation of solar energy. Current silicon-based solar cells require significant area of deployment to generate sufficient energy. Additionally, solar cells produce DC power which cannot practically be transported over long distances. For the most efficient applications, solar cells must be deployed within proximity to the location of power consumption.

Incorporating traditional silicon-based solar cells with buildings, as in building integrated photovoltaics (BIPVs), solves the problem of power transport. However, there is a limit to the extend at which silicon-based solar cells can be incorporated with buildings given that these devices are opaque and will certainly cause architectural issues. Here, we invent a method to design windows that serve the combined purpose of a transparent pane of glass and a solar energy harvesting site. We will refer to solar cells achieved by this design scheme as energy harvesting windows (EHWs) since the passive traditional window can be replaced with the ones designed by our method. Considering window application, this innovation eliminates the need for extra area of deployment. The challenge of power transport is also resolved by converting sunlight to energy at the site where this power would be used.

Semi-transparent organic photovoltaics (ST-OPVs) have the potential for integration with windows for ubiquitous power generating applications. Typically, such applications require that ST-OPVs be neutrally transparent across the visible and exhibit both a high average photopic transmittance (APT) and color rendering index, as well as iso-energetic chromaticity coordinates.

Due to the relatively high oscillator strengths of organic semiconductors, the photoactive layers of organic photovoltaics (OPVs) can be thin and yet absorb a significant fraction of the incident radiation within the relatively narrow absorption bands of the molecular excited states of the organic materials of which they are comprised. Hence, semitransparent OPVs (ST-OPVs) can utilize materials that are highly absorbing in the "invisible" infrared absorption bands but only weakly absorbing in the visible. These devices have several potential applications including integration with windows on buildings and automobiles. In such applications, the human perception of light transmitted through the ST-OPV should be as close as possible to that of natural sunlight. Ideally, this requires the device to exhibit a perceived neutral transmittance across the visible, a high color rendering index (CRI) at a correlated color temperature (CCT) of the solar disk of 5780 K, and close to isoenergetic Commission Internationale de l'Eclairage (CIE) chromaticity coordinates of (0.33, 0.33). In practice, however, the ST-OPV transmittance spectrum is not neutral since the absorption spectrum of the organic active layer is not usually flat over the visible wavelengths. This results in ST-OPVs exhibiting colored transmitted light, which is undesirable in most window applications.

As used herein, the term "visible" refers to the spectrum of light visible to most humans, contemplated herein as between 420 nm and 670 nm. As used herein, the term "near infrared" or "near-IR" refers to the lower infrared wavelengths, contemplated herein as between 671 nm and 2000 nm.

In this work, demonstrated is the design and use of optical coatings to achieve ST-OPVs with a neutral visible transmittance of APT=50%, a power conversion efficiency of 8.3%, and optical properties that are independent of a ±30° variation in the solar angle of incidence. These simple optical coatings are rapidly designed using a genetic algorithm and transfer matrix formalism. As used herein, "neutral visible transmittance" refers to a flat or substantially flat transmittance within the visible spectrum of light, for example a transmittance of 20%±5% across the range of 420 nm and 670 nm, or 30%±5%, or 50%±5%, or 60%±5%, or 70%±5%, or 80%±5%, or 90%±5%, or 20%±10%, or 30%±10%, or 40%±10%, or 50%±10%, or 60%±10%, or 70%±10%, or 80%±10%, or 90%±10% or 100%±10%.

SUMMARY OF THE INVENTION

In one aspect, an organic photovoltaic device comprises a first electrode, at least one organic heterojunction layer positioned over the first electrode, a second electrode positioned over the organic heterojunction layer, and a thin film stack positioned over the second electrode, comprising a plurality of sublayers of a first dielectric material alternating with a plurality of sublayers of a second dielectric material, wherein at least one of the plurality of sublayers of the first dielectric material has a thickness that is different from another of the plurality of sublayers of the first dielectric material, wherein the organic photovoltaic device has a mean transmittance of between 10% and 100% for light between 420 nm and 670 nm, with a variance of ±10%, and wherein an index contrast between the sublayers in the thin film stack is at least 0.1.

In one embodiment, the organic photovoltaic device has a mean transmittance of between 10% and 80%. In one embodiment, each of the sublayers of the first and second materials have different thicknesses from one another. In one embodiment, the organic photovoltaic device further comprises a UV-reflective coating positioned below the first electrode, configured to reflect or absorb at least 90% of light at wavelengths less than 400 nm. In one embodiment, the thin film stack is configured to reflect at least 40% of light at wavelengths between 670 nm and 2000 nm. In one embodiment, the first material comprises CBP and the second material comprises $MgF_2$. In one embodiment, the first and second electrodes comprise ITO. In one embodiment, the index contrast is at least 0.2. In one embodiment, the index contrast is at least 0.3. In one embodiment, the index contrast is at least 0.4.

In one embodiment, the thin film stack has no periodicity of layer thicknesses or indices of refraction. In one embodiment, the thin film stack is configured to reflect at least 90% of light at wavelengths between 670 nm and 2000 nm.

In one aspect, a method of fabricating an organic photovoltaic device comprises (a) stipulating a target transmittance of an organic photovoltaic device, (b) stipulating a number of sublayers in a thin film stack and first and second materials in the thin film stack, (c) designating the target transmittance as a fitness function of a genetic algorithm, (d) calculating the transmittance of a set of hypothetical devices having thin films with sublayer thicknesses selected by the genetic algorithm, (e) scoring a performance of each of the set of hypothetical devices, (f) discarding hypothetical devices from the set whose performance is below a predetermined threshold, retaining the rest of the hypothetical devices, (g) selecting a subsequent set of sublayer thicknesses with the genetic algorithm based on the retained hypothetical devices, (h) repeating steps d-g until a target performance is reached by one of the hypothetical devices, and (i) fabricating an organic photovoltaic device having the parameters of the hypothetical device.

In one aspect, an organic photovoltaic device comprises a first electrode, at least one organic heterojunction layer positioned over the first electrode, a second electrode positioned over the organic heterojunction layer, and a thin film stack positioned over the second electrode, comprising a plurality of sublayers of a first dielectric material alternating with a plurality of sublayers of a second dielectric material, wherein the organic photovoltaic device has a mean transmittance of between 10% and 100% for light in a first subset of a spectrum between 420 nm and 670 nm, with a variance of ±10%.

In one embodiment, each sublayer in the plurality of sublayers has a different thickness from every other sublayer of the plurality of sublayers. In one embodiment, the first subset of the spectrum is selected from red (620 nm-670 nm), green (490 nm-570 nm), or blue (440 nm-490 nm). In one embodiment, the device further comprises a reflector positioned between the second electrode and the thin film stack. In one embodiment, the reflector is a distributed Bragg reflector (DBR). In one embodiment, the reflector comprises a second plurality of sublayers. In one embodiment, the thin film stack is positioned adjacent to the second electrode.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION OF THE INVENTION

Figure 1:
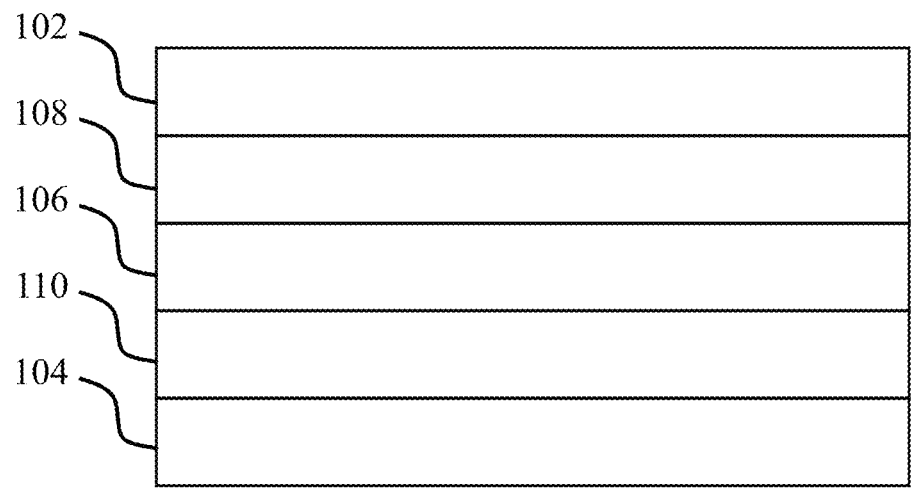
FIG. 1 is an exemplary organic photovoltaic device.

It is to be understood that the figures and descriptions of the present invention have been simplified to illustrate elements that are relevant for a clearer comprehension of the present invention, while eliminating, for the purpose of clarity, many other elements found in systems and methods for aperiodic optical coatings for neutral-color semi-permanent organic photovoltaics. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

As used herein, the terms "electrode" and "contact" may refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Examples of electrodes include anodes and cathodes, which may be used in a photosensitive optoelectronic device.

As used herein, the term "transparent" may refer to an electrode that permits at least 50% of the incident electromagnetic radiation in relevant wavelengths to be transmitted through it. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent.

As used herein, the term "semi-transparent" may refer to an electrode that permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used herein, the terms "donor" and "acceptor" refer to the relative positions of the highest occupied molecular orbital ("HOMO") and lowest unoccupied molecular orbital ("LUMO") energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Because ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, the term "band gap" ($E_g$) of a polymer may refer to the energy difference between the HOMO and the LUMO. The band gap is typically reported in electronvolts (eV). The band gap may be measured from the UV-vis spectroscopy or cyclic voltammetry. A "low band gap" polymer may refer to a polymer with a band gap below 2 eV, e.g., the polymer absorbs light with wavelengths longer than 620 nm.

As used herein, the term "excitation binding energy" ($E_B$) may refer to the following formula: $E_B=(M^++M^-)-(M^*+M)$, where $M^+$ and $M^-$ are the total energy of a positively and negatively charged molecule, respectively; $M^*$ and $M$ are the molecular energy at the first singlet state ($S_1$) and ground state, respectively. Excitation binding energy of acceptor or donor molecules affects the energy offset needed for efficient exciton dissociation. In certain examples, the escape yield of a hole increases as the HOMO offset increases. A decrease of exciton binding energy $E_B$ for the acceptor molecule leads to an increase of hole escape yield for the same HOMO offset between donor and acceptor molecules.

As used herein, power conversion efficiency ($\eta_p$) may be expressed as:

$$\eta_p = \frac{V_{OC}*FF*J_{SC}}{P_O} \qquad \text{Equation 1}$$

wherein $V_{OC}$ is the open circuit voltage, FF is the fill factor, $J_{SC}$ is the short circuit current, and $P_O$ is the input optical power.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Although certain embodiments of the disclosure are discussed in relation to one particular device or type of device (for example OPVs) it is understood that the disclosed improvements may be equally applied to other devices, including but not limited to OLEDs, PLEDs, charge-coupled devices (CCDs), photosensors, or the like.

Although exemplary embodiments described herein may be presented as methods for producing particular circuits or devices, for example OPVs, it is understood that the materials and structures described herein may have applications in devices other than OPVs. For example, other optoelectronic devices such as OLEDs and organic photodetectors may employ the materials and structures. More generally, organic devices, such as organic transistors, or other organic electronic circuits or components, may employ the materials and structures.

In some embodiments, the optoelectronic device has one or more characteristics selected from the group consisting of being flexible, being rollable, being foldable, being stretchable, and being curved. In some embodiments, the optoelectronic device is transparent or semi-transparent.

In some embodiments, the optoelectronic device further comprises a layer comprising carbon nanotubes.

Organic Photovoltaic Cells

As disclosed herein, the various systems and methods disclosed herein may be provided within a single-junction solar cell or a tandem or multi junction solar cell.

FIG. 1 depicts an example of various layers of a single junction solar cell or organic photovoltaic cell (OPV) 100. The OPV cell may include two electrodes having an anode 102 and a cathode 104 in superposed relation, at least one donor composition, and at least one acceptor composition, wherein the donor-acceptor material or active layer 106 is positioned between the two electrodes 102, 104. In some embodiments, at least one intermediate layer 108 may be positioned between the anode 102 and the active layer 106. Additionally, or alternatively, at least one intermediate layer 110 may be positioned between the active layer 106 and cathode 104.

The anode 102 may include a conducting oxide, thin metal layer, or conducting polymer. In some examples, the anode 102 includes a (e.g., transparent) conductive metal oxide such as indium tin oxide (ITO), tin oxide (TO), gallium indium tin oxide (GITO), zinc oxide (ZO), or zinc indium tin oxide (ZITO). In other examples, the anode 102 includes a thin metal layer, wherein the metal is selected from the group consisting of Ag, Au, Pd, Pt, Ti, V, Zn, Sn, Al, Co, Ni, Cu, Cr, or combinations thereof. In yet other examples, the anode 102 includes a (e.g., transparent) conductive polymer such as polyanaline (PANI), or 3,4-polyethyl-enedioxythiophene: polystyrenesulfonate (PEDOT:PSS).

The thickness of the anode 102 may be 0.1-100 nm, 1-10 nm, 0.1-10 nm, or 10-100 nm.

The cathode 104 may be a conducting oxide, thin metal layer, or conducting polymer similar or different from the materials discussed above for the anode 102. In certain examples, the cathode 104 may include a metal or metal alloy. The cathode 104 may include Ca, Al, Mg, Ti, W, Ag, Au, or another appropriate metal, or an alloy thereof.

The thickness of the cathode 104 may be 0.1-100 nm, 1-10 nm, 0.1-10 nm, or 10-100 nm.

As noted above, the OPV may include one or more intermediate layers, for example charge collecting/transporting intermediate layers positioned between an electrode 102, 104 and the active region or layer 106. The intermediate layer 108, 110 may be a metal oxide. In certain examples, the intermediate layer 108, 110 includes $MoO_3$, $V_2O_5$, ZnO, or $TiO_2$. In some examples, the first intermediate layer 108 has a similar composition as the second intermediate layer 110. In other examples, the first and second intermediate layers 108, 110 have different compositions.

The thickness of each intermediate layer may be 0.1-100 nm, 1-10 nm, 0.1-10 nm, or 10-100 nm.

The active region or layer 106 positioned between the electrodes 102, 104 includes a composition or molecule having an acceptor and a donor. In some embodiments, the composition may be arranged as an acceptor-donor-acceptor (A-D-A).

Figure 2:
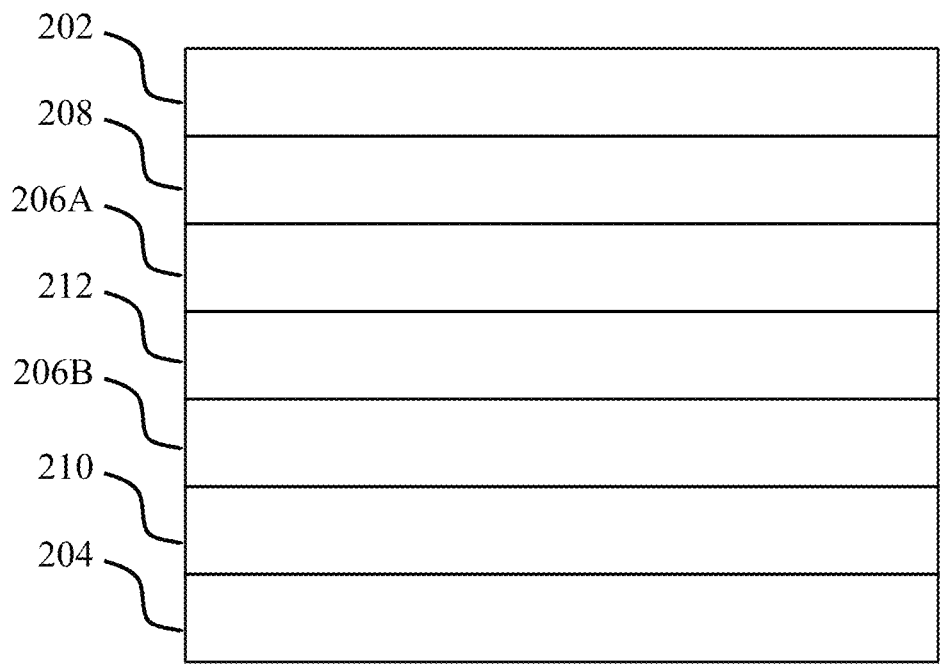
FIG. 2 is an exemplary organic photovoltaic device.

FIG. 2 depicts an example of various layers of a tandem or multi junction solar cell or organic photovoltaic cell (OPV) 200. The OPV cell may include two electrodes having an anode 202 and a cathode 204 in superposed relation, at least one donor composition, and at least one acceptor composition positioned within a plurality of active layers or regions 206A, 206B between the two electrodes 202, 204. While only two active layers or regions 206A, 206B are depicted in FIG. 2, additional active layers or regions are also possible.

At least one intermediate layer 208 may be positioned between the anode 202 and a first active layer 206A. Additionally, or alternatively, at least one intermediate layer 210 may be positioned between the second active layer 206B and cathode 204.

At least one intermediate layer 212 may be positioned between the first active layer 206A and the second active layer 206B.

The compositions, thicknesses, etc. of each layer may be the same as those discussed with reference to FIG. 1.

The active region or layer 106, 206A, 206B positioned between the electrodes includes a composition or molecule having an acceptor and a donor. The composition may be arranged as an acceptor-donor-acceptor (A-D-A).

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. A dendrimer may be a "small molecule," and it is believed that all dendrimers currently used in the field of organic opto-electronic devices are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of a material. A ligand may be referred to as "ancillary" when it is believed that the ligand does not contribute to the photoactive properties of a material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower" energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

In some aspects of the present invention, software executing the instructions provided herein may be stored on a non-transitory computer-readable medium, wherein the software performs some or all of the steps of the present invention when executed on a processor.

Aspects of the invention relate to algorithms executed in computer software. Though certain embodiments may be described as written in particular programming languages, or executed on particular operating systems or computing platforms, it is understood that the system and method of the present invention is not limited to any particular computing language, platform, or combination thereof. Software executing the algorithms described herein may be written in any programming language known in the art, compiled or interpreted, including but not limited to C, C++, C#, Objective-C, Java, JavaScript, MATLAB, Python, PHP, Perl, Ruby, or Visual Basic. It is further understood that elements of the present invention may be executed on any acceptable computing platform, including but not limited to a server, a cloud instance, a workstation, a thin client, a mobile device, an embedded microcontroller, a television, or any other suitable computing device known in the art.

Parts of this invention are described as software running on a computing device. Though software described herein may be disclosed as operating on one particular computing device (e.g. a dedicated server or a workstation), it is understood in the art that software is intrinsically portable and that most software running on a dedicated server may also be run, for the purposes of the present invention, on any of a wide range of devices including desktop or mobile devices, laptops, tablets, smartphones, watches, wearable electronics or other wireless digital/cellular phones, televisions, cloud instances, embedded microcontrollers, thin client devices, or any other suitable computing device known in the art.

Similarly, parts of this invention are described as communicating over a variety of wireless or wired computer networks. For the purposes of this invention, the words "network", "networked", and "networking" are understood to encompass wired Ethernet, fiber optic connections, wireless connections including any of the various 802.11 standards, cellular WAN infrastructures such as 3G, 4G/LTE, or 5G networks, Bluetooth®, Bluetooth® Low Energy (BLE) or Zigbee® communication links, or any other method by which one electronic device is capable of communicating with another. In some embodiments, elements of the networked portion of the invention may be implemented over a Virtual Private Network (VPN).

Figure 3:
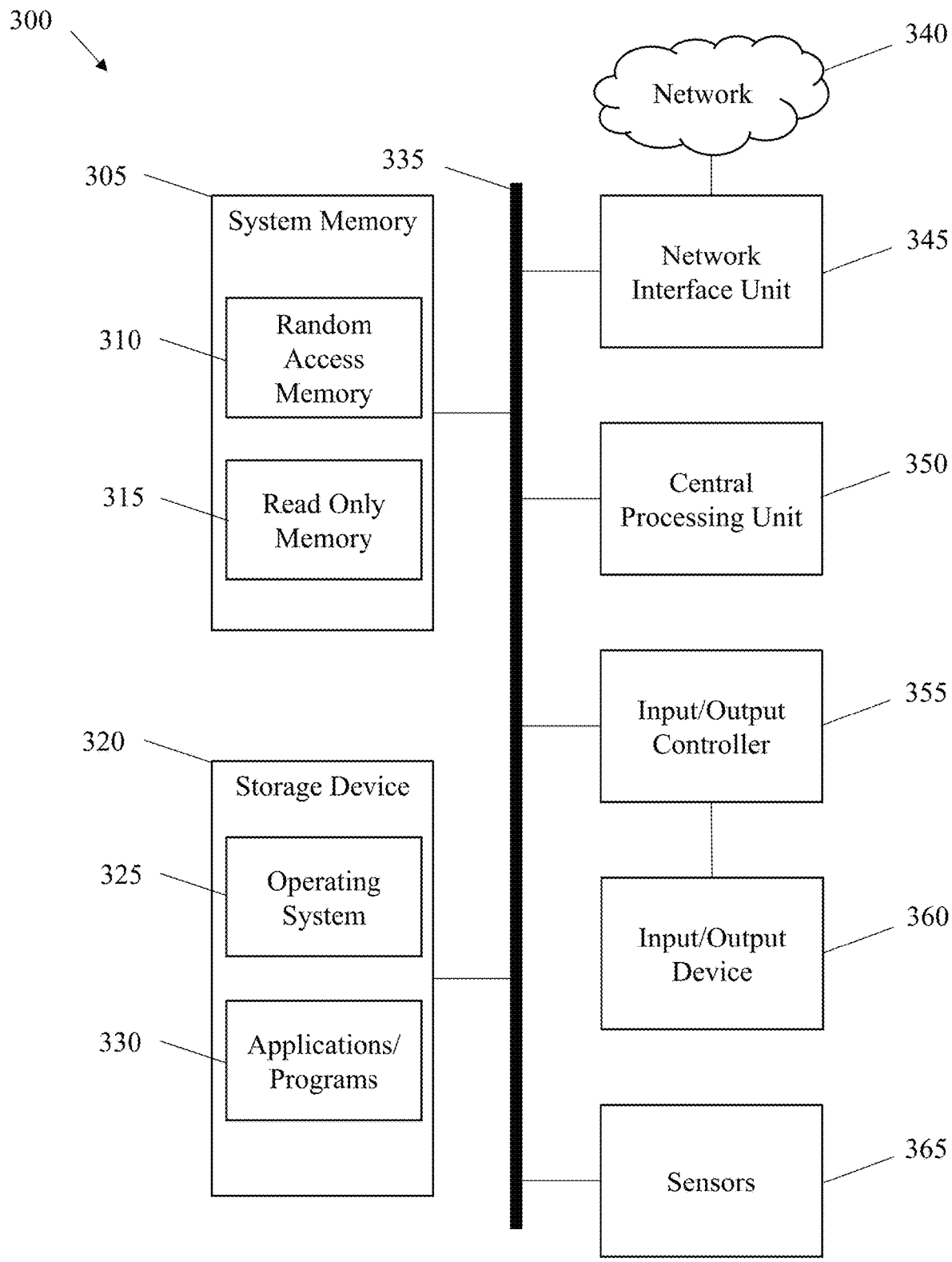
FIG. 3 is an exemplary computing device.

FIG. 3 and the following discussion are intended to provide a brief, general description of a suitable computing environment in which the invention may be implemented. While the invention is described above in the general context of program modules that execute in conjunction with an application program that runs on an operating system on a computer, those skilled in the art will recognize that the invention may also be implemented in combination with other program modules.

Generally, program modules include routines, programs, components, data structures, and other types of structures that perform particular tasks or implement particular abstract data types. Moreover, those skilled in the art will appreciate that the invention may be practiced with other computer system configurations, including hand-held devices, multi-processor systems, microprocessor-based or programmable consumer electronics, minicomputers, mainframe computers, and the like. The invention may also be practiced in distributed computing environments where tasks are performed by remote processing devices that are linked through a communications network. In a distributed computing environment, program modules may be located in both local and remote memory storage devices.

FIG. 3 depicts an illustrative computer architecture for a computer 300 for practicing the various embodiments of the invention. The computer architecture shown in FIG. 3 illustrates a conventional personal computer, including a central processing unit 350 ("CPU"), a system memory 305, including a random access memory 310 ("RAM") and a read-only memory ("ROM") 315, and a system bus 335 that couples the system memory 305 to the CPU 350. A basic input/output system containing the basic routines that help to transfer information between elements within the computer, such as during startup, is stored in the ROM 315. The computer 300 further includes a storage device 320 for storing an operating system 325, application/program 330, and data.

The storage device 320 is connected to the CPU 350 through a storage controller (not shown) connected to the bus 335. The storage device 320 and its associated computer-readable media provide non-volatile storage for the computer 300. Although the description of computer-readable media contained herein refers to a storage device, such as a hard disk or CD-ROM drive, it should be appreciated by those skilled in the art that computer-readable media can be any available media that can be accessed by the computer 300.

By way of example, and not to be limiting, computer-readable media may comprise computer storage media. Computer storage media includes volatile and non-volatile, removable and non-removable media implemented in any method or technology for storage of information such as computer-readable instructions, data structures, program modules or other data. Computer storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other medium which can be used to store the desired information and which can be accessed by the computer.

According to various embodiments of the invention, the computer 300 may operate in a networked environment using logical connections to remote computers through a network 340, such as TCP/IP network such as the Internet or an intranet. The computer 300 may connect to the network 340 through a network interface unit 345 connected to the bus 335. It should be appreciated that the network interface unit 345 may also be utilized to connect to other types of networks and remote computer systems.

The computer 300 may also include an input/output controller 355 for receiving and processing input from a number of input/output devices 360, including a keyboard, a mouse, a touchscreen, a camera, a microphone, a controller, a joystick, or other type of input device. Similarly, the input/output controller 355 may provide output to a display screen, a printer, a speaker, or other type of output device. The computer 300 can connect to the input/output device 360 via a wired connection including, but not limited to, fiber optic, Ethernet, or copper wire or wireless means including, but not limited to, Wi-Fi, Bluetooth, Near-Field Communication (NFC), infrared, or other suitable wired or wireless connections.

As mentioned briefly above, a number of program modules and data files may be stored in the storage device 320 and/or RAM 310 of the computer 300, including an operating system 325 suitable for controlling the operation of a networked computer. The storage device 320 and RAM 310 may also store one or more applications/programs 330. In particular, the storage device 320 and RAM 310 may store an application/program 330 for providing a variety of functionalities to a user. For instance, the application/program 330 may comprise many types of programs such as a word processing application, a spreadsheet application, a desktop publishing application, a database application, a gaming application, internet browsing application, electronic mail application, messaging application, and the like. According to an embodiment of the present invention, the application/program 330 comprises a multiple functionality software application for providing word processing functionality, slide presentation functionality, spreadsheet functionality, database functionality and the like.

The computer 300 in some embodiments can include a variety of sensors 365 for monitoring the environment surrounding and the environment internal to the computer 300. These sensors 365 can include a Global Positioning System (GPS) sensor, a photosensitive sensor, a gyroscope, a magnetometer, thermometer, a proximity sensor, an accelerometer, a microphone, biometric sensor, barometer, humidity sensor, radiation sensor, or any other suitable sensor.

Referring now in detail to the drawings, in which like reference numerals indicate like parts or elements throughout the several views, in various embodiments, presented herein is a system and method for aperiodic optical coatings for neutral-color semi-permanent organic photovoltaics.

Figure 4:
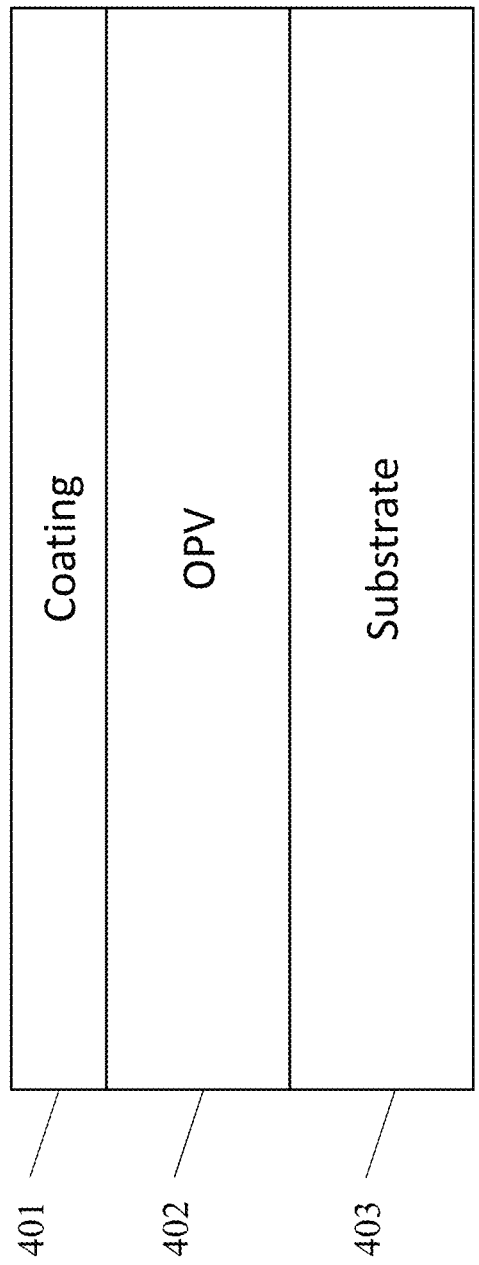
FIG. 4 is a diagram of an exemplary organic photovoltaic device with a coating.

An energy harvesting window (EHW) as contemplated herein may in some embodiments be designed using a combination of genetic algorithms and transfer matrix formalism. In one embodiment, the window is segmented into three parts (see FIG. 4). The substrate 403 may comprise regular window material, for example glass or plexiglass. The middle segment 402 comprises an active thin film organic photovoltaic (OPV) that in some embodiments absorbs in only a subset of the solar spectrum, for example mainly in the near infrared (NIR) region of the solar spectrum. This gives the window its energy harvesting property. Due to spectrally nonconstant absorption and refractive index, the active middle section 402 reshapes the transmittance spectrum of the light going through the EHW resulting in a generally colored, non-neutral transmitted light which may be undesirable in several applications. The topmost segment 401 increases transmittance of the window and also reshapes the transmittance spectrum so that the window remains highly and neutrally transparent, for example having neutral visible transmittance as described above.

Disclosed herein is a combination of genetic algorithm (GA) optimization (M. Kumar, et al., SSRN Electron. J. 2, 451-454 (2020); D. Beasley, et al., Univ. Comput. 2, (1993); K. Rabinovitch and G. Toker, Proc. SPIE 2262, 163-174 (1994)) and transfer matrix calculations (P. Peumans, et al., J. Appl. Phys. 93, 3693-3723 (2003); M. C. Troparevsky, et al., Opt. Express 18, 24715 (2010); G. R. Fowles, *Introduction to Modern Optics* (1989). O. S. Heavens and S. F. Singer, Phys. Today 9(3), 24 (1956); L. A. A. Pettersson, et al., J. Appl. Phys. 86, 487-496 (1999)) to efficiently design multilayer thin film coatings to optimize ST-OPVs, whose transmission spectra are close to that of natural sunlight. In some embodiments this improvement modifies an ST-OPV to have a high and flat transmittance spectrum within the visible while increasing its power conversion efficiency (PCE). It does this by reflecting near infrared (NIR) photons, allowing them a second pass through the active layer where they can be absorbed. In anticipation of window applications, some embodiments of the disclosed device are designed to be resilient to relatively large changes in the solar angle of incidence, for example approximately ±30°, to maintain high efficiency during the diurnal and annual solar cycles.

Forward calculations may be employed to achieve optical outcoupling structures that improve the average photopic transmittance (APT). (Y. Li, et al, Adv. Mater. 31, 1903173-1903178 (2019)). One drawback to this method is that it is difficult to optimize the outcoupling structure for an arbitrary combination of film number, compositions, and thicknesses, since one has to calculate for all combinations and permutations of these three parameters and then select the optimum. As the number of layers increases, this becomes computationally arduous. Betancur et al. previously reported optical coatings employing inverse solutions to calculate all possible outcomes of optical coatings for a given set of parameters (R. Betancur, et al., Nat. Photonics 7, 995-1000 (2013)). This technique becomes increasingly inefficient as the number of thin film layers and the optimization criteria expand. Here, the inverse problem is solved by stipulating the target transmittance of the ST-OPV and then seeking the optimal optical thin film structure to achieve that result. The method is both efficient and general. An archetype OPV is then fabricated based on a non-fullerene acceptor and a polymer donor, and it was found that the target experimental optical outcoupling/reflection structure is achieved based on the computational algorithms and fitness criteria.

The transmittance spectrum of light propagating through a stack of thin films can be calculated using transfer matrix formalism and can be tailored by varying the thicknesses and numbers of the layers within the stack (P. Peumans, et al., J. Appl. Phys. 93, 3693-3723 (2003)). The thicknesses of the layers comprising the coating for ST-OPVs are targeted to achieve ~50% neutral transmittance from 400 to 650 nm. This inverse calculation solves for the layer thicknesses once their number and refractive indexes are chosen. The target transmittance is defined as the fitness function that is approached using a genetic algorithm that improves on successive populations (i.e., generations) of possible coatings until an optimum is achieved.

The optimization routine is further described below. In one embodiment, a population of possible coatings is established, each consisting of n thin film layers with thicknesses initially assigned by the GA. In the disclosed method, n can in some embodiments be an even number, for example 2, 4, 6, 8, 10, 12, 20, 25, 30, 40, 50, 60, 70, 80, 90, 100, etc., or may in some embodiments be odd, for example 1, 3, 5, 7, 9, 11, 15, 21, 26, 31, 41, 51, 61, 71, 81, 91, 101, etc. In some embodiments, where the thin film layers include materials having different indices of refraction, the material having the lower index of refraction is positioned on the surface of the device distal from the illumination source (e.g., on the inside of the window having an integrated OPV). For each stack within this population, the transmittance of the full device is calculated and is used as input for evaluation against a set of target parameters; viz., transmittance, APT, and CIE. The algorithm then scores the optical performance of the device against these parameters and updates the thicknesses of the layers within stacks by forming a new population of stacks. The process is repeated until the optimal thicknesses of the layers are asymptotically approached, as determined by the value of the fitness parameter.

The optimized structures of the coatings applied to the semi-transparent organic photovoltaics (ST-OPVs) disclosed herein were achieved by a combination of genetic algorithm (GA) optimization and transfer matrix formalism.

In some embodiments, a device as contemplated herein may be designed to have neutral visible transmittance as disclosed above, and/or may have a transmittance over a first range of the spectrum which may be expressed as a mean transmittance value, for example about 10%, about 20%, about 30%, about 40%, about 50%, about 60%, about 70%, about 80%, about 90%, or about 100%, or between 10% and 100%, or between 10% and 90%, or between 10% and 80%, or between 20% and 80%, or between 40% and 80%, or between 40% and 70%, or any intervening range. The transmittance over the first range of the spectrum may further be characterized by a variance over the first range of the spectrum, for example ±20%, ±10%, ±8%, ±5%, ±2%, or any other suitable variance.

Although certain examples presented herein have a neutral visible transmittance, e.g. a relatively flat (as described above) transmittance across the visible spectrum of 420 nm-670 nm, (or in some embodiments 400 nm-780 nm) it is understood that in some embodiments a coating may be configured to deliver a flat transmittance across at least one subset of the visible spectrum, including but not limited to individual colors, e.g. violet (400 nm-420 nm), indigo (420 nm-440 nm), blue (440 nm-490 nm), green (490 nm-570 nm), yellow (570 nm-585 nm), orange (585 nm-620 nm), and/or red (620 nm-670 nm or 620 nm-780 nm). In some embodiments a coating may be designed to transmit one or more subsets of the spectrum and to reflect one or more subsets of the spectrum, in any combination.

Genetic Algorithm

Figure 5:
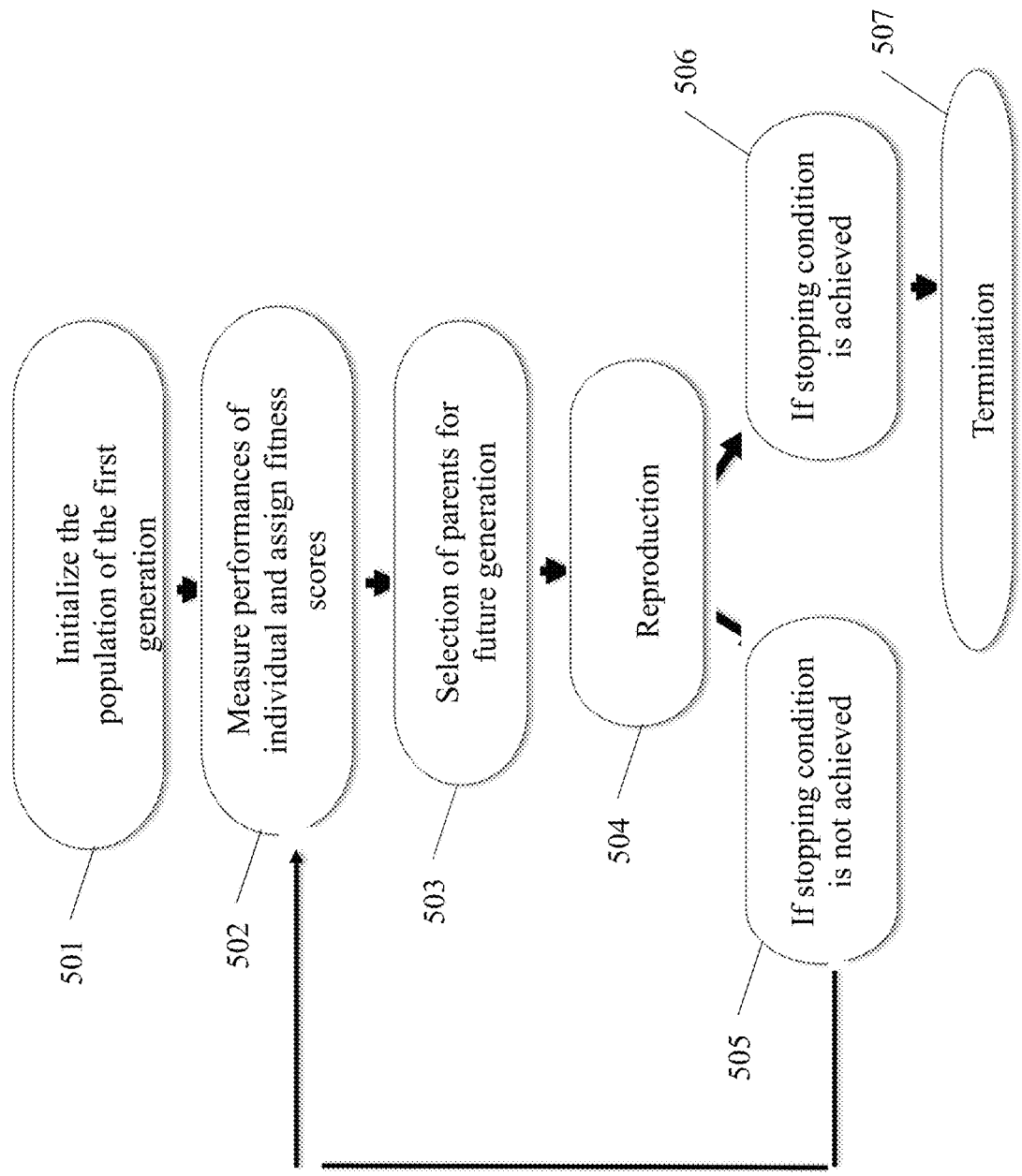
FIG. 5 is a flow chart illustrating the genetic algorithm procedure.

A shown in FIG. 5, the genetic algorithm (GA) is a global optimization search algorithm that mimics the evolutionary process of natural selection. In its implementation, an initial population of N random individuals is created in step 501. The ability of the individual data set to survive within the existing conditions of the problem space is measured by its performance within the domain of the objective function and assigned a "fitness score" in step 502, which in turn determines its probability to continue to the next generation of fitness. Selection for the next generation of fitness takes place in step 503, for example by comparing the assigned fitness scores to one another (e.g. choosing the k highest scoring individuals) or by comparing the assigned fitness scores to a threshold and selecting all fitness scores above the threshold. In some embodiments, an algorithm may select only those fitness scores which increased from their respective parent. In some embodiments, a certain percentage of the population is selected, for example the highest 50%, the highest 60%, or the highest 70%.

By this means, the fittest individuals are maintained while the less fit ones are removed from the population. This routine may then be repeated on the subsequent populations (the "reproduction" step 504, following condition 505 and looping back to performance measurement 502) and continued until a stopping condition is achieved as the existing population reaches its optimum (see steps 506 and 507).

This algorithm is used to achieve the optimum coatings for devices within the constraints of a preset, objective function. Beginning with a population of N possible coatings, an objective function is used which requires the transmittance of an ST-OPV to be zero for wavelengths shorter than 400 nm and longer than 650 nm, and constant at a certain threshold, for example 50%, from 400 to 640 nm. In some embodiments, the threshold may be other levels, including but not limited to 30%, 40%, 60%, 70%, or 80%. Use of a threshold ensures a high average photopic transmittance (APT) and color rendering index (CRI), iso-energetic Commission Internationale de l'Eclairage (CIE) chromaticity coordinates of (0.33, 0.33), and increased power conversion efficiency (PCE) due to enhanced absorption of near-infrared (NIR) photons. Each individual coating within a population comprises n thin film layers, each layer having a thickness of $l_i$, where i runs from 1 to n. The transmittance of the ST-OPV with a given individual coating (thicknesses and number) is scored against the target transmittance function, and the coating is either advanced to the subsequent population or eliminated based upon its fitness score. By this means, new coating populations are formed that perform better than each previous one. The routine is repeated for each new population and continued in this manner until the optimal population is achieved as determined by the stipulated stopping criteria.

Optical Transfer Matrix Formalism

Figure 6:
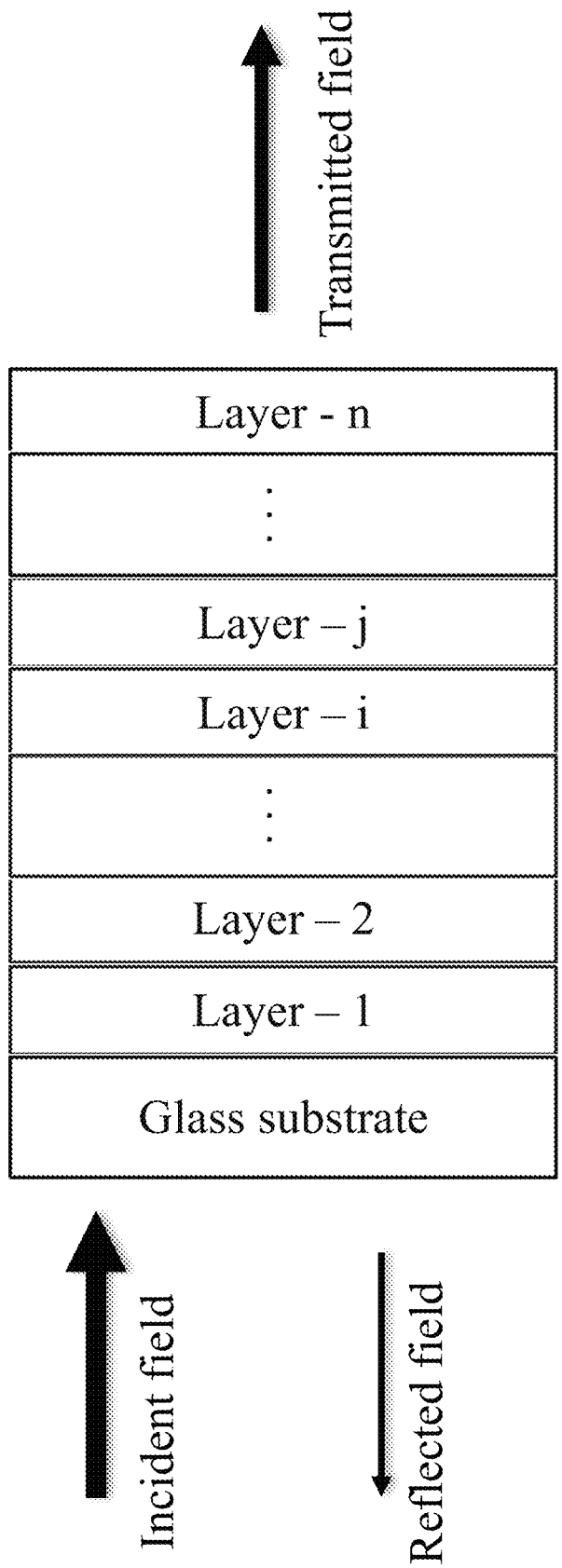
FIG. 6 is an example of a layer structure used in the transfer matrix calculation.

Now referring to FIG. 6, the optical transfer matrix formalism is illustrated. Light is normally incident upon the surface of a stack of dielectrics. Optical transfer matrix formalism can be used to determine the reflectance and transmittance at each interface as well as any point within this structure. At the interface between the jth and kth layers with light incident from the jth layer, the electric fields in the jth and kth layers are related by the following equation:

$$\begin{pmatrix} E_j^+ \\ E_j^- \end{pmatrix} = \frac{1}{t_{jk}} \begin{pmatrix} 1 & r_{jk} \\ r_{jk} & 1 \end{pmatrix} \begin{pmatrix} E_k^+ \\ E_k^- \end{pmatrix} \Rightarrow E_j = I_{jk} E_k \qquad \text{Equation 2}$$

where $t_{jk}$ and $r_{jk}$ are the Fresnel transmission and reflection coefficients, respectively. This relation can easily be generalized for oblique incidence. Assuming normal incidence, the Fresnel coefficients are:

$$t_{jk} = \frac{2n_j}{n_j + n_k};$$

$$r_{jk} = \frac{n_j - n_k}{n_j + n_k} \qquad \text{Equation 3}$$

where boldface $n_j$ and $n_k$ represent the complex refractive index of the jth and kth layers, respectively. If the light propagates through layer k and if this layer is lossy, the amplitude of the light wave is expected to be attenuated and the phase of the wave is expected to change. This absorption and phase change can be represented by the layer matrix for layer k as:

$$L_k = \begin{pmatrix} \exp\left(-\frac{2\pi \lambda l_k}{n_k}\right) & 0 \\ 0 & \exp\left(\frac{2\pi \lambda l_k}{n_k}\right) \end{pmatrix} \qquad \text{Equation 4}$$

where $l_k$ is the thickness of the kth layer. The electric field after the kth layer is then related to electric field incident from within the jth layer by the following equation:

$$E_j = I_{jk} L_k E_k = S_{jk} E_k \quad \text{Equation 5}$$

The matrix $S_{jk}$ is called the transfer matrix and relates the transmitted electric field after the kth layer to the electric field incident upon the kth layer from within the jth layer. If there are several dielectric layers stacked in order from layer—1 to layer—n upon, for instance, a glass substrate with air at the other end of the nth layer, and if this light is normally incident from the direction of the glass substrate into the stack of dielectrics, then the electric field within the glass is related to electric field transmitted to air at the far end of the dielectric stack by the following equation:

$$\begin{pmatrix} E^+_{glass} \\ E^-_{glass} \end{pmatrix} = \begin{pmatrix} s_{11} & s_{12} \\ s_{21} & 1s_{22} \end{pmatrix} \begin{pmatrix} E^+_{air} \\ E^-_{air} \end{pmatrix} \Rightarrow E_{glass} = S \cdot E_{air} \quad \text{Equation 6}$$

Where S, the overall transfer matrix of the structure, is just the product of the individual transfer matrices of each dielectric layer; namely, $$S = \left( \prod_{i=1}^{n} I_{(i-1)i} L_i \right) \cdot I_{n,air} \quad \text{Equation 7}$$

The transmission and reflection coefficients are extracted from the overall transfer matrix, respectively, as $t = 1/s_{11}$ and $r = s_{21}/s_{11}$ and the transmittance T, and reflectance, R are given respectively as:

$$T = \frac{n_{air}}{n_{glass}} |t|^2; \quad \text{Equation 8}$$

$$R = |r|^2$$

With this procedure, the transmittances due to each the candidate coating within a given population may be calculated and the structures that best yields the desired transmittance are selected to exist in future populations by the GA. Applied to the ST-OPV, one needs to also consider the air-glass substrate interface. This will require a correction to equation (S7) for the glass substrate as has been shown by P. Peumans, et al., J. Appl. Phys. 93, 3693-3723 (2003).

Simulations

Figure 7:
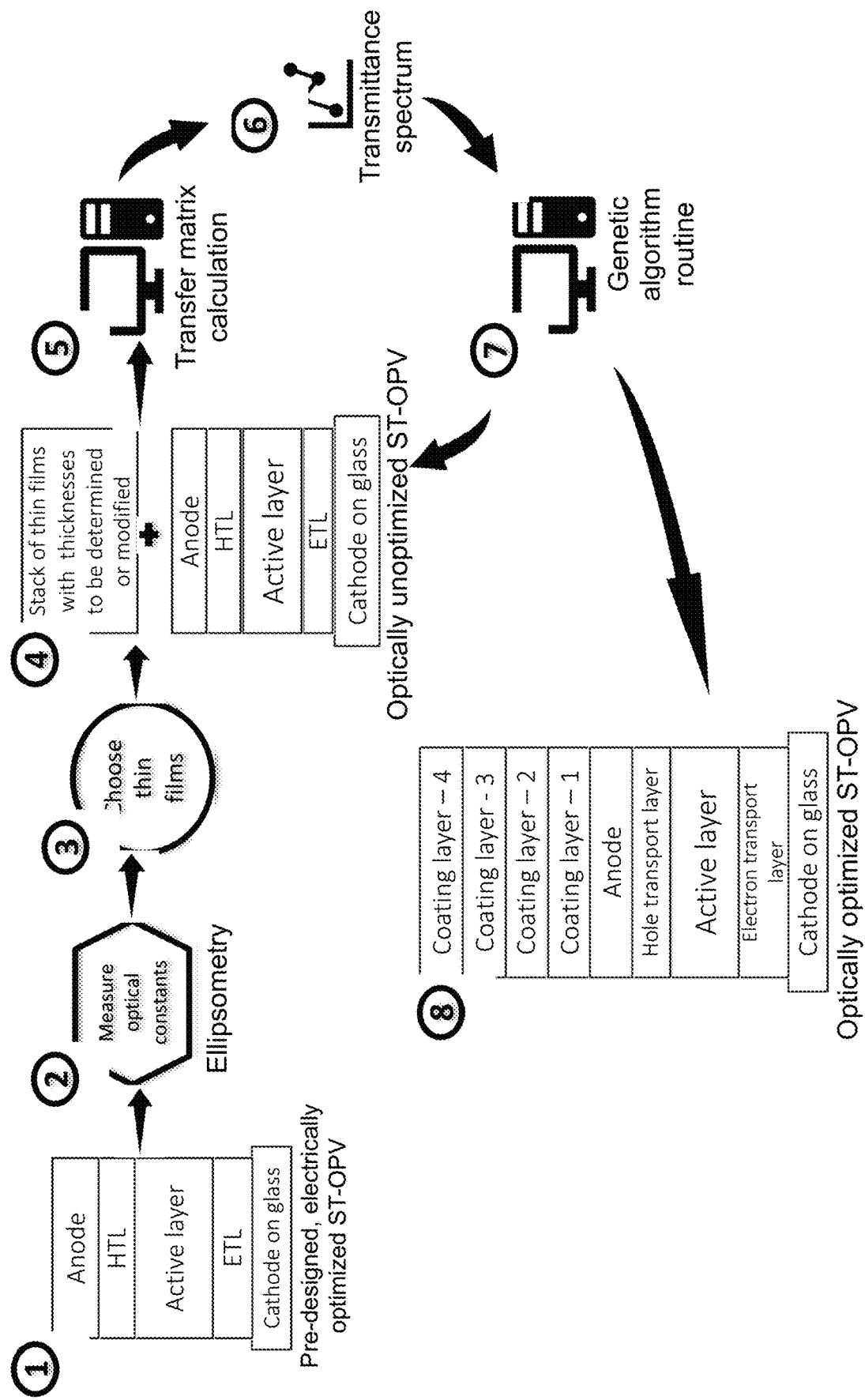
FIG. 7 is a flow chart showing the procedure for optical coating optimization as presented herein.

Now referring to FIG. 7, the flow of the optimization calculation is illustrated. In step 1, an electrically optimized, inverted, and uncoated ST-OPV is fabricated. The thicknesses and optical constants of the thin film layers comprising the uncoated device, as well as those of candidate materials that will subsequently comprise the optimized optical thin film coating, are measured by ellipsometry in step 2. Based upon this these measurements, steps 3 and 4 comprise selecting suitable materials and stacking them in layers on top of the anode of the ST-OPV. At this point the resulting device, which is an uncoated ST-OPV and coating, is not optimized at step 4. The number and thicknesses of these layers remain unknown at this point. The search for the optimal thin film coating commences by GA initially creating a population of N possible coatings and assigning a set of thicknesses to n thin film layers for each member within this population. Then, in steps 5 and 6, a transfer matrix calculation is used to calculate the transmittance of the full device and the result is input into the GA. The routine then advances to step 7 where the GA compares the performance of the transmittance function to a set of target parameters, including but not limited to target transmittance, APT, CRI, and CIE. The GA evaluates the optical performance against these parameters and assigns a fitness score to the coating. This is iterated for every coating within each population. After each iteration, the algorithm updates the population of coatings by eliminating those that result in the worst optical performance of the ST-OPV and replacing them with more efficient ones. Thus, the optical performance of the ST-OPV in each subsequent population of coatings is better than the previous one. Steps 4 through 7 are repeated until a stopping criterion is achieved and the resulting population is the optimum, with the modification in step 4. The population is no longer randomly chosen but is selected based upon the fitness criteria of the previous one. In step 8, the routine finally selects the best coating from the population yielding the optically optimized full ST-OPV device.

In some embodiments, the GA functions as described above to calculate an improved optical coating comprising a single aperiodic stack of a set of sublayers. In other embodiments, the GA may be modified to calculate multiple aperiodic stacks of sublayers together (i.e., a fitness score of a single coating comprising multiple aperiodic stacks deposited on top of one another, each aperiodic stack comprising a plurality of sublayers). In such embodiments, the multiple aperiodic stacks may comprise the same or different materials from one another.

Figures 8A, 8B:
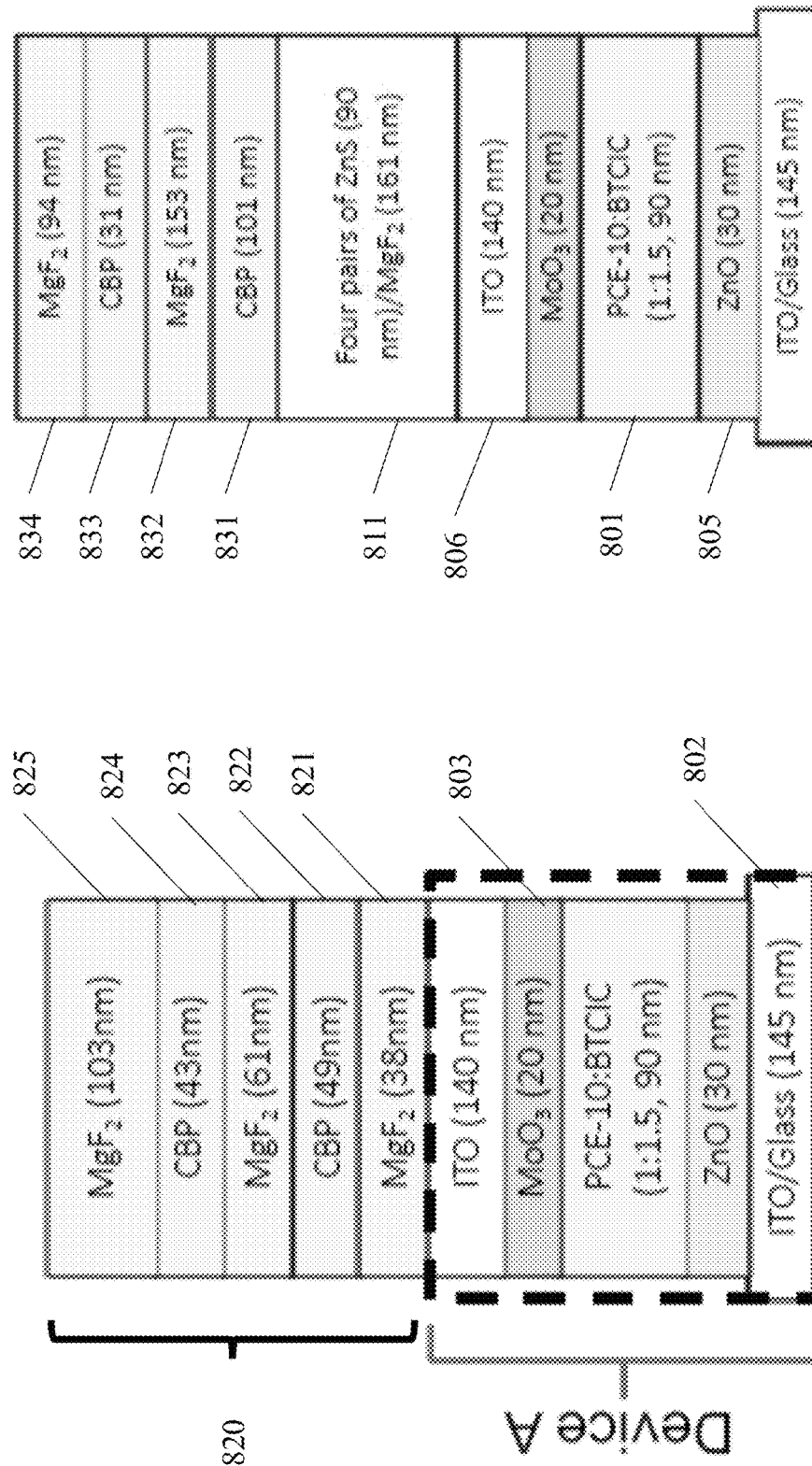
FIG. 8A shows the structure of a device B with the coated device A indicated by the dashed rectangle.
FIG. 8B is an exemplary structure of a device C with the uncoated device A.

Exemplary devices of the present disclosure are shown in FIG. 8A and FIG. 8B. As shown in FIG. 8A, Device A is represented by the dotted rectangle, and lacks outcoupling and reflecting layers. Device A comprises a substrate, for example a glass substrate 802. The substrate may in some embodiments comprise a thin electrode layer, for example a thin transparent (e.g. ITO) electrode layer as shown in FIG. 8A. In various embodiments the thin electrode layer may be a cathode or an anode. In the depicted example, the ITO layer shown on the top surface of substrate 802 is a cathode.

Devices may further comprise charge transport layers positioned between the electrodes and the active layer, for example electron transport layer 805, which comprises ZnO, and hole transport layer 803, which comprises MoOx. The active layer 801 comprises a donor material and an acceptor material configured to form a heterojunction. Any donor/acceptor combination may be used, as understood in the art.

The anode 806 of Devices A, B, and C comprises ITO, but as contemplated herein any conductive material may be used. In some embodiments, for example in window-integrated devices, transparent or semitransparent electrodes may be used as the anode and/or the cathode.

Devices B and C comprise optical coatings, each comprising an aperiodic stack of sublayers. The exemplary optical coating 820 comprises alternating layers of $MgF_2$ (821, 822, 825) and 4,4"-Bis(N-carbazolyl)-1,1"-biphenyl (CBP) (822, 824) stacked above the anode 806. While the present example is described with alternating $MgF_2$ and CBP layers, it is understood that other materials, for example any two dielectric materials, may be used in coatings contemplated herein, including but not limited to $SiO_2$, TiOx, ZnS, SiN, $Al_2O_3$, or any two dielectrics with an index contrast of at least 0.1, at least 0.15, at least 0.2, at least 0.3, or at least 0.4.

Another device, Device C shown in FIG. 8B, comprises a reflector 811, which in the depicted embodiment is a distributed Bragg Reflector (DBR). The DBR 811 may be configured to reflect all or a subset of photons, for example NIR photons, back into the active layer. The reflector may in some embodiments comprise an alternating stack of sublayers, for example one or more pairs of different materials. In embodiments with a reflector 811, an aperiodic stack may be positioned atop the reflector 811, for example the two pairs of aperiodic CBP-MgF$_2$ layers (831-834) whose thicknesses may be determined by the disclosed GA.

In various embodiments, the disclosed method may be applied to either side of a windowpane. In many applications, it is desirable to prevent UV light from entering an OPV segment and deteriorating the energy harvesting capability of the window. In some embodiments, a device as disclosed herein may comprise a UV stop filter applied to the light incident side of the glass pane (or substrate) using the disclosed design scheme for this purpose.

Figure 9B:
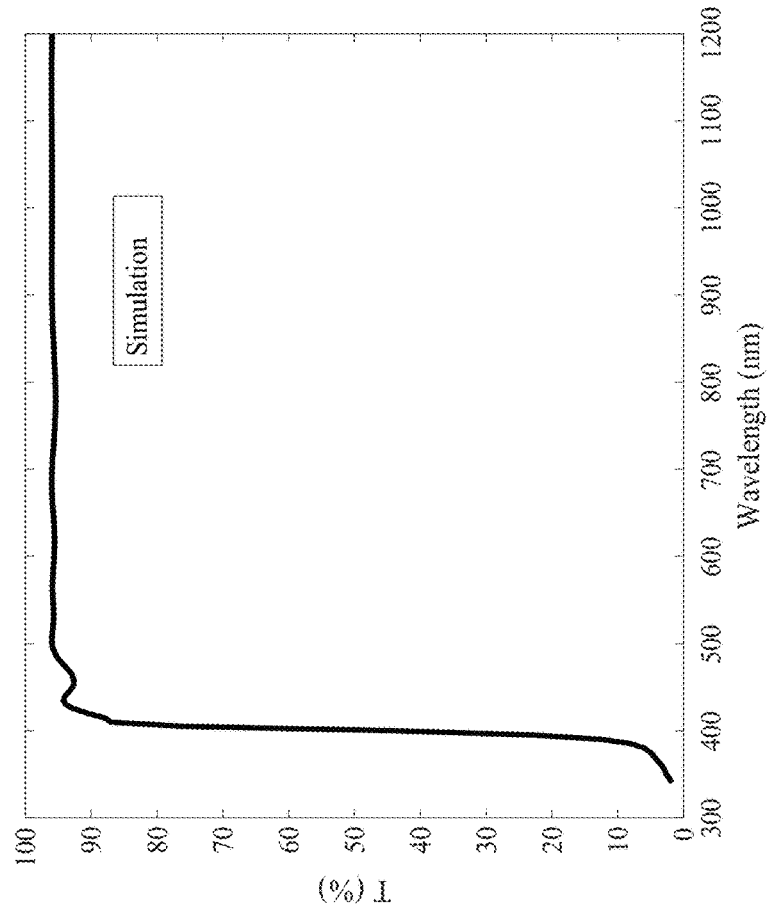
FIG. 9B is a diagram of transmittance versus wavelength of a UV blocking structure.
Figure 9A:
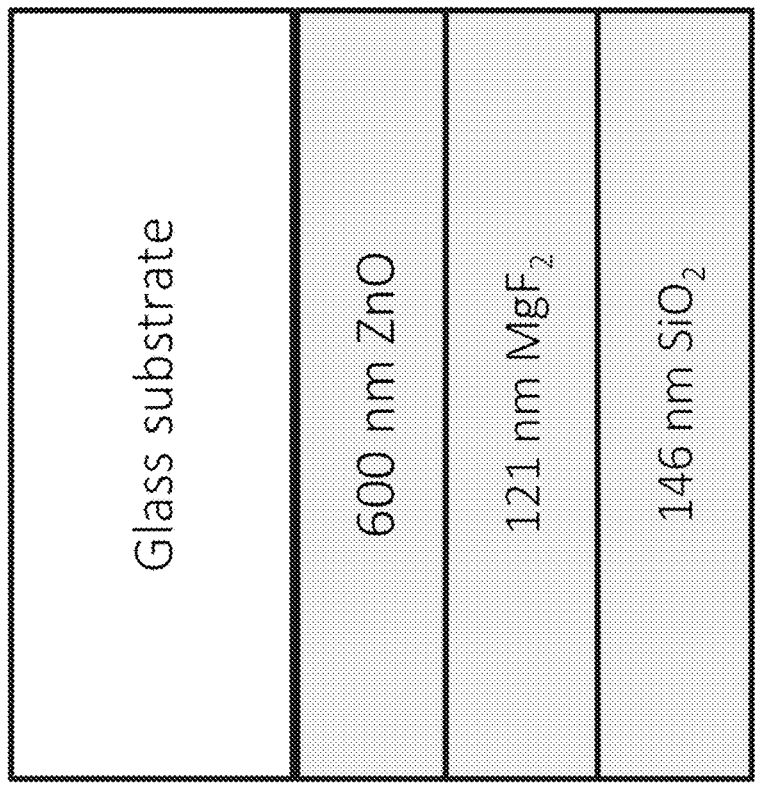
FIG. 9A is an exemplary organic photovoltaic device with a UV blocking structure.

FIG. 9A shows an exemplary UV stop filter design, with the corresponding transmittance spectrum shown in FIG. 9B.

Combination with Other Materials

The materials described herein as useful for a particular layer in an organic optoelectronic device may be used in combination with a wide variety of other materials present in the device. The materials described or referred to below are non-limiting examples of materials that may be useful in combination with the compounds disclosed herein, and one of skill in the art can readily consult the literature to identify other materials that may be useful in combination.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Experimental Examples

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present invention. The following working examples therefore, specifically point out the exemplary embodiments of the present invention, and are not to be construed as limiting in any way the remainder of the disclosure.

With reference now to FIG. 8A and FIG. 8B, a set of example devices are shown variously implementing coatings designed by the methods disclosed herein. The ST-OPV active layer 801 in all depicted devices comprises a 2:3 (wt/wt) blend of the polymer donor, poly[4,8-bis(5-(2-ethylhexyl)thiophen-2-yl)benzo[1,2-b; 4,5-bldithiophene-2,6-diyl-alt-(4-(2-ethylhexyl)-3-fluorothieno[3,4-b]thiophene+2-carboxylate-2-6-diyl)](PCE-10), and the non-fullerene acceptor (NFA), 4,4,10,10-tetrakis(4-hexylphenyl)-5,11-(2-ethylhexyloxy)-4,10-dihydrodithienyl[1,2-b:4,5b']benzodithiophene-2, 8-diyl)bis(2-(3-oxo-2,3-dihydroinden-5,6-dichloro-1-ylidene)malononitrile) (BT-CIC). However, it is understood that the methods contemplated herein may be used with devices having any donor/acceptor combination may be used.

As shown in FIG. 8A, Device A is represented by the dotted rectangle, and lacks outcoupling and reflecting layers. Device A was fabricated on a glass substrate with the following structure: indium tin oxide (ITO) (145 nm)/ZnO (30 nm)/active layer (90 nm)/MoOx (20 nm)/ITO (140 nm). The glass substrate with a 2-mm-wide patterned ITO cathode with a sheet resistance of 15 Ω/sq (802) was commercially acquired from Luminescence Technology Corp. known as Lumtec. A ZnO solgel precursor was spin-coated onto the ITO side of the substrate and annealed at 160° C. in air for 30 min to form the ZnO layer. A solution of the active layer 801 was spin coated on the ZnO followed by deposition of MoOx 803 by vacuum thermal evaporation (VTE) at a rate of 0.5 Å/s in a chamber with a base pressure of 1×10$^{-7}$ Torr. Finally, the ITO anode 806 of the device was deposited through a metal shadow mask having the same pattern as the cathode but oriented orthogonally to the cathode, resulting in a device area of 4 mm$^2$. The anode 806 was deposited by magnetron sputtering at a rate of 1.7 Å/s in a chamber with a base pressure of 1×10$^{-7}$ Torr.

Figure 10:
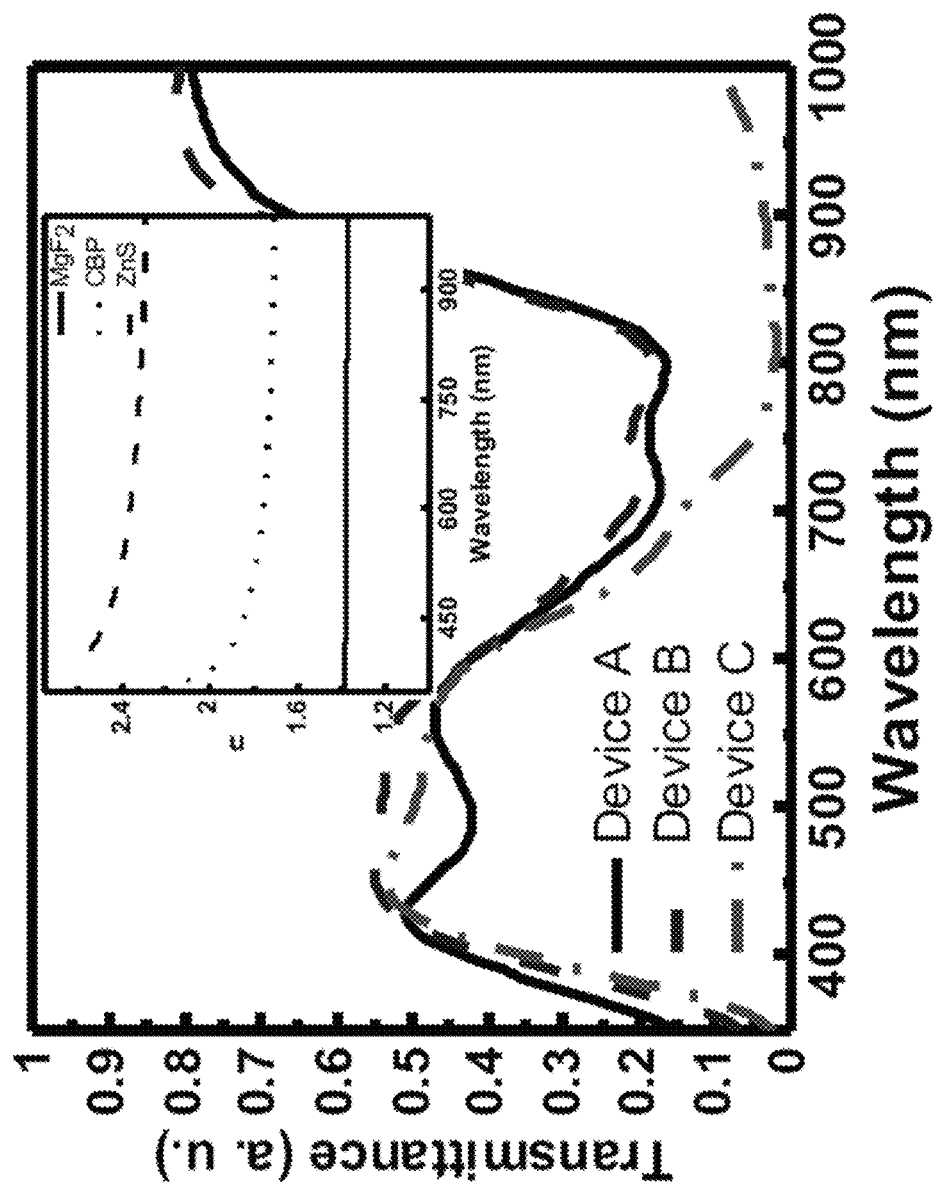
FIG. 10 is a transmittance spectra of devices A, B, and C, and the inset graph represents the indexes of refraction of $MgF_2$, CBP, and ZnS used to calculate the layer of thickness of the coatings.

The GA optimization routine was implemented to determine the thicknesses of the layers of the optical coating 820 comprising aperiodic, alternating layers of MgF$_2$ (821, 822, 825) and 4,4"-Bis(N-carbazolyl)-1,1"-biphenyl (CBP) (822, 824) stacked above the anode 806. The optimal coating in Device B shown in FIG. 8A was determined to be MgF$_2$ (38 nm)/CBP (59 nm)/MgF$_2$ (61 nm)/CBP (42 nm)/MgF$_2$ (103 nm), which were deposited onto the anode of Device B, shown in FIG. 8A. The refractive indices of the optical coating materials used as calculation inputs (MgF$_2$, CBP, and ZnS) are shown in the inset, FIG. 10. The materials have almost constant refractive indexes from 400 to 1000 nm, negligible extinction coefficient, and significant index contrasts, making them suitable for broadband optical outcoupling coatings.

To ensure optimal outcoupling while also reflecting NIR photons back into the active layer, a third device, Device C, was fabricated. Its structure is shown in FIG. 8B, and includes a distributed Bragg reflecting (DBR) stack 811 made of four pairs of alternating 90 nm ZnS and 161 nm of MgF$_2$ grown on top of the anode 806 of the uncoated device followed by two pairs of aperiodic CBP-MgF$_2$ layers (831-834) with thicknesses determined by the disclosed GA. In all of the devices, the thickness of each layer was measured by ellipsometry.

Figure 11B:
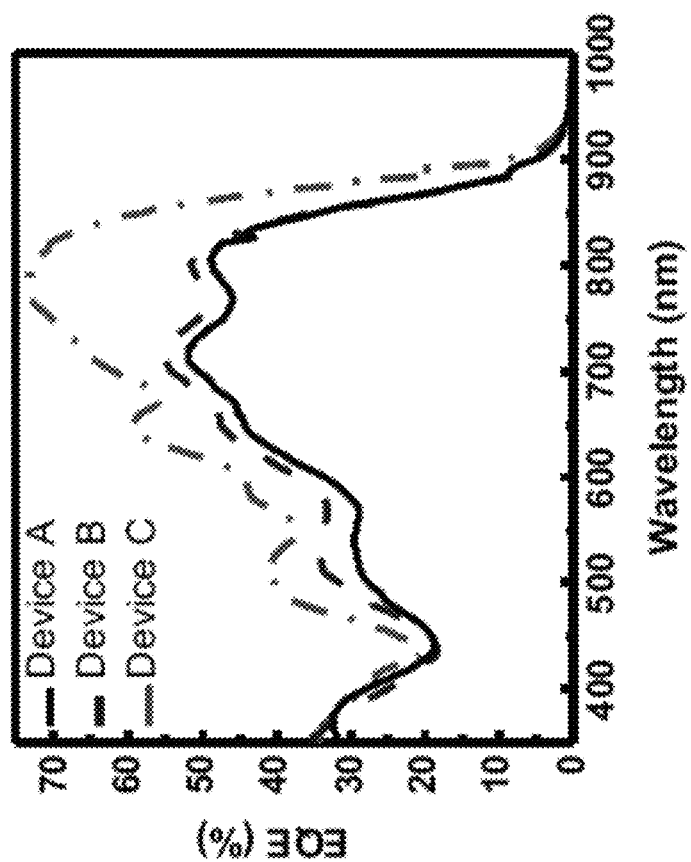
FIG. 11B is a graph representing the external quantum efficiency (EQE) spectra of devices A, B, and C.
Figure 11A:
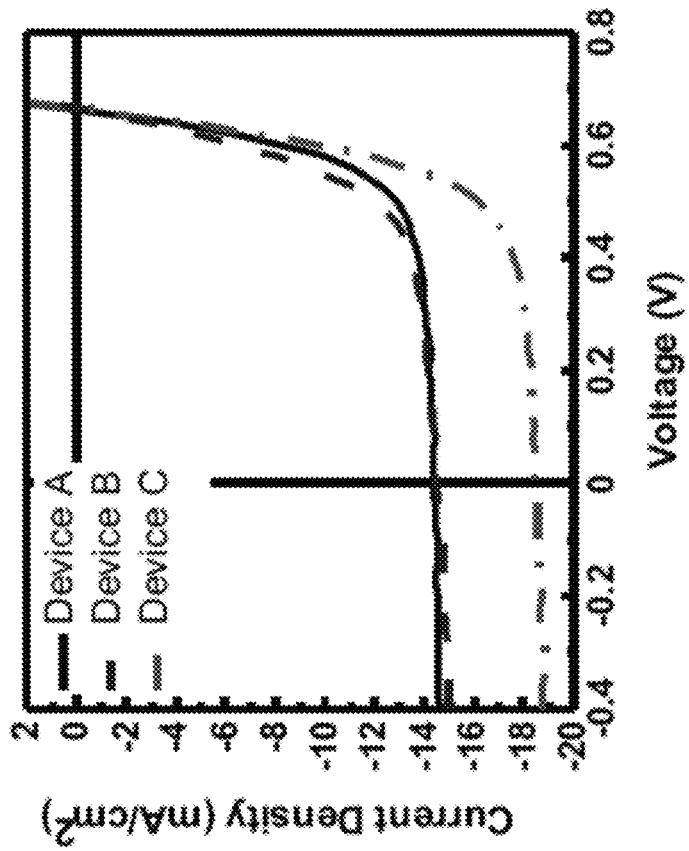
FIG. 11A is a graph representing the current density-voltage characteristics of devices A, B, and C.

The current density-voltage (J-V) characteristics of Devices A, B, and C were measured using a semiconductor parameter analyzer under 1 sun intensity (100 mW/cm$^2$), simulated AM1.5G illumination. The external quantum efficiencies (EQEs) of the devices were measured using a white light source and a monochromator at wavelength steps of 5 nm and a Si reference detector calibrated by Newport Corporation according to American Society for Testing and Materials (ASTM) standards E948-09 and E1021-06, for J-V and quantum efficiency measurements, respectively. The transmittance spectra of all the devices were measured using a Perkin Elmer UV-VIS spectrophotometer. The transmittances of Devices B and C were more neutrally transparent within the visible than that of Device A. This can be seen in FIG. 10, where the transmittances of Devices B and C show a negligible wavelength dependence between 400 and 650 nm compared to that of Device A. FIG. 11A shows the J-V characteristics of the devices. The J-V characteristics of Devices A and B coincide, indicating that the optical structure employed for B does not degrade performance. In contrast, the short circuit current density ($J_{SC}$) of Device C is larger than either A or B due to recycling of NIR photons. The consequence of this reflection is evident in FIG. 11B where Device C exhibits a higher external quantum efficiency (EQE) in the NIR compared to the other two devices.

Figure 12B:
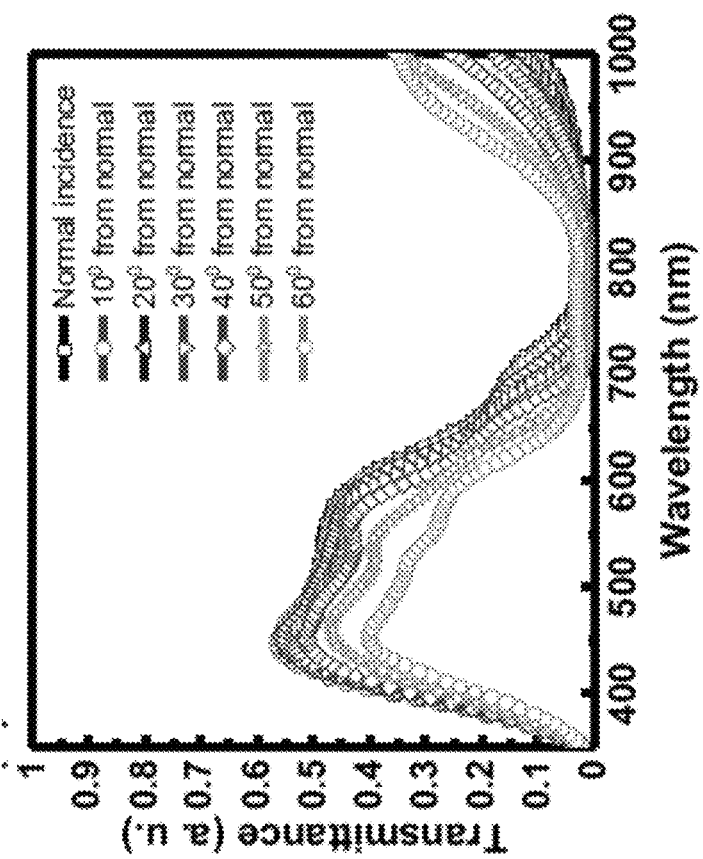
FIG. 12B is a graph illustrating the angle dependent transmittance spectra of device C showing insensitivity to ±30° deviation in illumination from normal incidence.
Figure 12A:
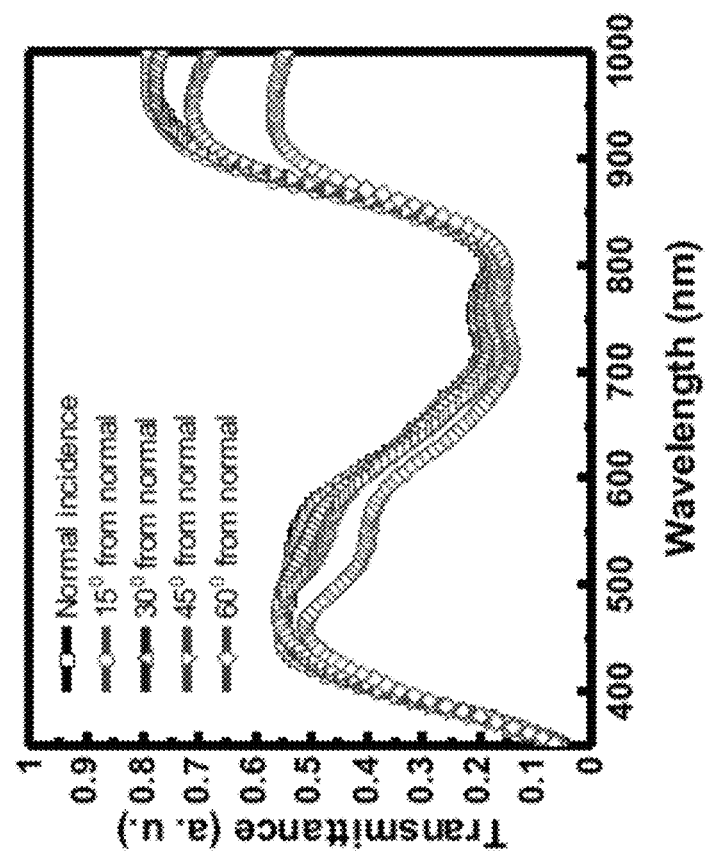
FIG. 12A is a graph illustrating the angle dependent transmittance spectra of device B.
Figure 13B:
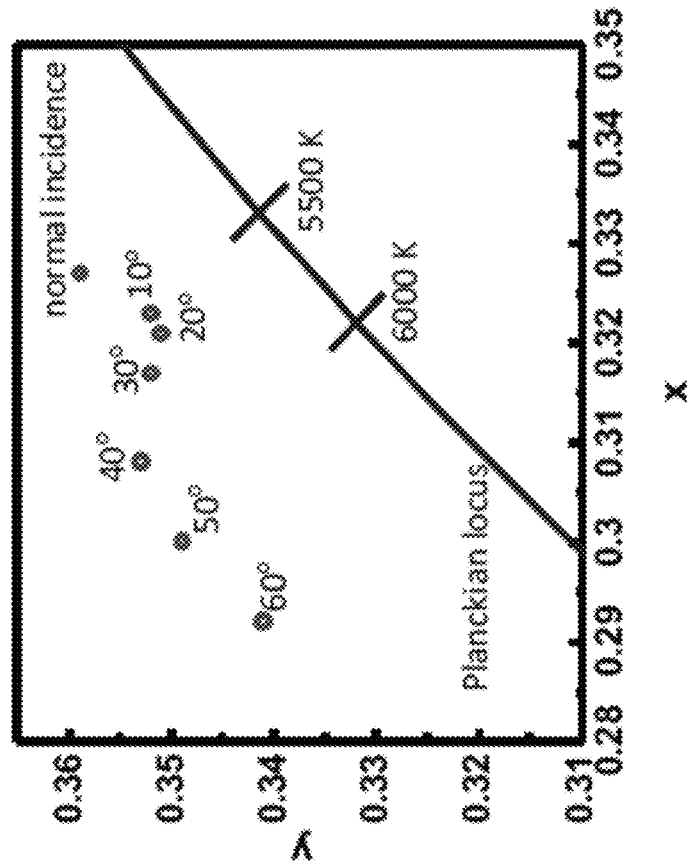
FIG. 13B is an exemplary graph of shifts in the CIE coordinates of device C with incidence angle. For clarity, only a small portion of the CIE color space and color temperature is shown.
Figure 13A:
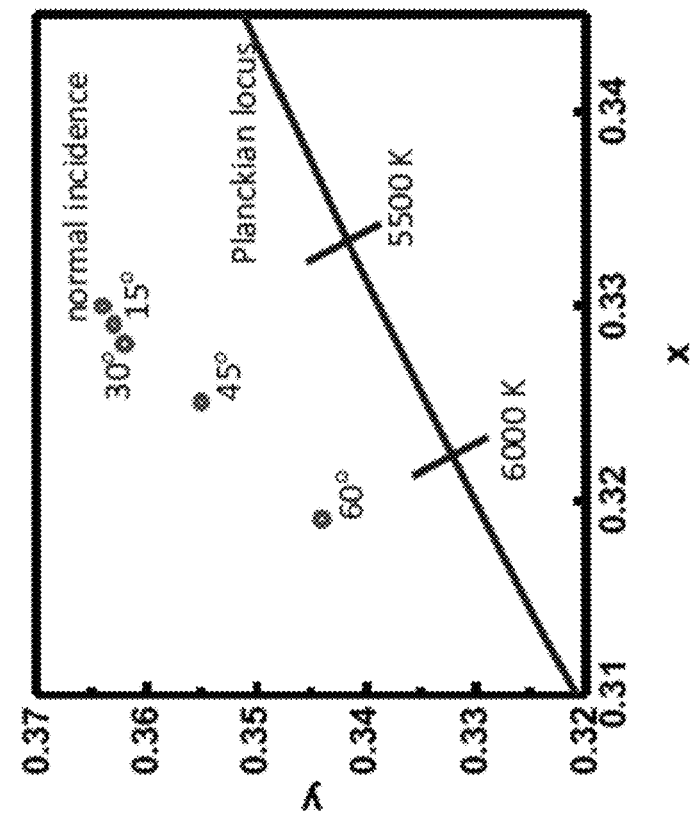
FIG. 13A is an exemplary graph of shifts in the CIE coordinates of device B.

FIG. 12A and FIG. 12B show the variation in transmittance as a function of light incidence angle for Devices B and C. Both devices show little change for angles up to ±30°. This is also apparent in FIG. 13A and FIG. 13B, where the shift in CIE coordinates for both devices is negligible up to angles of 30°.

The PCE, APT, and light utilization efficiency, LUE, which is the product of PCE and APT, for each of the three devices are given in Table I below. The uncoated device has PCE=5.9±0.2% while Devices B and C have PCE=6.1±0.1% and 8.3±0.1%, respectively. The APT of the uncoated device is improved by the optical coatings from 44% to 49% for B and 46% for C. Thus, the LUE of the uncoated device increases from 2.6% to 3.0% for B and 3.8% for C.

TABLE I

| | $J_{SC}$ (mA/cm²) | $V_{OC}$ (V) | FF (%) | PCE (%) | APT (%) | LUE (%) |
|---|---|---|---|---|---|---|
| Device A (uncoated) | 14.4 ± 0.3 | 0.68 ± 0.01 | 60.0 ± 1.0 | 5.9 ± 0.2 | 44 | 2.6 |
| Device B | 14.2 ± 0.1 | 0.68 ± 0.01 | 62.7 ± 0.1 | 6.1 ± 0.1 | 49 | 3.0 |
| Device C | 18.6 ± 0.1 | 0.67 ± 0.01 | 66.0 ± 0.3 | 8.3 ± 0.1 | 46 | 3.8 |

The variation of the optical properties of the devices with respect to the angle of incidence is given in Tables II and III for Devices B and C, respectively.

TABLE II

| | Uncoated device (normal incidence) | Normal incidence | 15° | 30° | 45° | 60° |
|---|---|---|---|---|---|---|
| APT (%) | 44 | 49 | 49 | 47 | 45 | 38 |
| CCT (K) | 5214 | 5599 | 5599 | 5599 | 6007 | 6073 |
| CIE | (0.344, 0.363) | (0.330, 0.364) | (0.329, 0.363) | (0.328, 0.362) | (0.325, 0.355) | (0.319, 0.344) |
| CRI | 88 | 89 | 89 | 90 | 91 | 91 |

TABLE III

| | Normal Incidence | 10° | 20° | 30° | 40° | 50° | 60° |
|---|---|---|---|---|---|---|---|
| APT (%) | 46 | 46 | 45 | 43 | 40 | 35 | 28 |
| CCT (K) | 5599 | 6038 | 6038 | 6038 | 7649 | 6987 | 3623 |
| CIE | (0.327, 0.359) | (0.323, 0.352) | (0.321, 0.351) | (0.317, 0.352) | (0.308, 0.353) | (0.300, 0.349) | (0.292, 0.341) |
| CRI | 86 | 86 | 84 | 81 | 76 | 70 | 66 |

Within the 400-650 nm wavelength range, the transmittance spectrum of the uncoated device indicates a noticeable green tint with CCT=5214 K and CRI=88 and chromaticity coordinates of (0.34, 0.36). In contrast, transmittance of Device B is neutral between 400 and 650 nm. FIG. 11A, FIG. 11B, and Table I show that the performance of Device B is slightly improved from that of Device A as a result of the optical coating. At normal incidence, Device B has APT=49%, CCT=5599 K, CIE=(0.33, 0.36), and CRI=89, values that are largely independent of the angle of incidence. Furthermore, the chromaticity coordinates of B fall well within the zone where the color is perceived to be neutral and remain within an area of the size of a typical MacAdam ellipse for changes in incidence angle of ±30°. Therefore, there is no noticeable change in the color of objects throughout the day. Similarly, at normal incidence, Device C has APT=46% and CRI=86, with the other values identical to Device B. For both Device B and Device C, these values remain unchanged for angles of incidence ranging from 0° to ±30°.

The 400-650 nm transmittance spectral band of Device C and its independence to changes in the angle are similar to those of Device B. The coating design employed for Device C (i.e., DBR+ aperiodic layers) serves as a bandpass filter. This ensures that the interiors of buildings are shielded from thermal as well as harmful ultraviolet (UV) radiation. The short circuit current density of Device C is higher than that of both the uncoated Device A and Device B due to the recycling of NIR photons. The active layer employed for all the three devices primarily absorbs between 600 and 900 nm, as apparent from the EQE spectra in FIG. 11B. The reflection of the NIR photons in Device C gives rise to the increased EQE and hence the improvement in Jsc. Therefore, Device C achieves PCE=8.3% or 41% and 36% improvement over A and B, respectively. Also, C has an LUE=3.8%, which is the highest among the three devices. Although the shifts in CIE coordinates with the change in the angle of incidence are small for both Devices B and C, the CIE coordinates of Device C shift more than those of Device B due to the relatively narrow passband of the DBR.

In conclusion, the disclosed examples demonstrate the use of GA and transfer matrix formalism to design and implement aperiodic thin film coatings for ST-OPVs to achieve high neutral transmittance and increased PCE. The optimization scheme used to design the coatings is not only simple and computationally efficient but robust since the genetic algorithm proceeds by improving upon the parameters of a given "possible" solution so that a subsequent solution is better than the one that precedes it (D. Beasley, et al., Univ. Comput. 2, 1-16 (1993)). The process also employs minimal computational time since there is no need to try out all of the possible combinations of the optical structures to achieve an optimum. The devices coated with the thin film show resilience to changes in their optical properties for up to ±30° variation from the normal angle of incidence, which is important ST-OPVs for window applications.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention.

REFERENCES

The following publications are incorporated by reference herein in their entireties:

Peumans, P., Yakimov, A. & Forrest, S. R. Small molecular weight organic thin-film photodetectors and solar cells. *J. Appl. Phys.* 93, 3693-3723 (2003).

Sheriff, H. K. M., Li, Y., Qu, B. & Forrest, S. R. Aperiodic optical coatings for neutral-color semi-transparent organic photovoltaics. *Appl. Phys. Lett.* 118, (2021).

Pettersson, L. A. A., Roman, L. S. & Inganas, O. Modeling photocurrent action spectra of photovoltaic devices based on organic thin films. *J. Appl. Phys.* 86, 487-496 (1999).

Kumar, M., Husain, M., Upreti, N. & Gupta, D. Genetic Algorithm: Review and Application. *SSRN Electron. J.* 2, 451-454 (2020).

Beasley, D., Bull, D. R. & Martin, R. R. An overview of genetic algorithms: Part 1, fundamentals. Univ. *Comput.* 2, 1-16 (1993).

Forrest, S. R. Organic Electronics: Foundations to Applications. (Oxford University Press, 2020).

Wang, W., Yan, C., Lau, T., Wang, J., Liu, K., Fan, Y., Lu, X. & Zhan, X. Fused Hexacyclic Nonfullerene Acceptor with Strong Near-Infrared Absorption for Semitransparent Organic Solar Cells with 9.77% Efficiency. *Adv. Mater.* 29, 1-7 (2017).

Li, Y., Ji, C., Qu, Y., Huang, X., Hou, S., Li, C., Liao, L., Guo, L. J. & Forrest, S. R. Enhanced Light Utilization in Semitransparent Organic Photovoltaics Using an Optical Outcoupling Architecture. *Adv. Mater.* 31, 1-8 (2019).

Li, Y., Lin, J., Che, X., Qu, Y., Liu, F., Liao, L. & Forrest, S. R. High Efficiency Near-Infrared and Semitransparent Non-Fullerene Acceptor Organic Photovoltaic Cells. *J. Am. Chem. Soc.* 139, 17114-17119 (2017).

Cui, Y., Yang, C., Yao, H., Zhu, J., Wang, Y., Jia, G., Gao, F. & Hou, J. Efficient Semitransparent Organic Solar Cells with Tunable Color enabled by an Ultralow-Bandgap Nonfullerene Acceptor. *Adv. Mater.* 29, 1-7 (2017).

Bailey-Salzman, R. F., Rand, B. P. & Forrest, S. R. Semitransparent organic photovoltaic cells. *Appl. Phys. Lett.* 88, 8-11 (2006).

Colsmann, A., Puetz, A., Bauer, A., Hanisch, J., Ahlswede, E. & Lemmer, U. Efficient semi-transparent organic solar cells with good transparency color perception and rendering properties. *Adv. Energy Mater.* 1, 599-603 (2011).

Guo, F., Chen, S., Chen, Z., Luo, H., Gao, Y., Przybilla, T., Spiecker, E., Osvet, A., Forberich, K. & Brabec, C. J. Printed Smart Photovoltaic Window Integrated with an Energy-Saving Thermochromic Layer. *Adv. Opt. Mater.* 3, 1524-1529 (2015).

Betancur, R., Romero-Gomez, P., Martinez-Otero, A., Elias, X., Maymo, M. & Martorell, J. Transparent polymer solar cells employing a layered light-trapping architecture. *Nat. Photonics* 7, 995-1000 (2013).

Rabinovitch, K. & Toker, G. Genetic algorithm and thin-film design. *Opt. Thin Film. IV New Dev.* 2262, 163-174 (1994).

Troparevsky, M. C., Sabau, A. S., Lupini, A. R. & Zhang, Z. Transfer-matrix formalism for the calculation of optical response in multilayer systems: from coherent to incoherent interference. *Opt. Express* 18, 24715 (2010).

Fowles. Introduction to Modern Optics. (1989).

Heavens, O. S. & Singer, S. F. Optical Properties of Thin Solid Films. *Phys. Today* (1956). doi:10.1063/1.3059910

Hafiz K. M. Sheriff Jr., Yongxi Li, Boning Qu, and Stephen R. Forrest, "Aperiodic optical coatings for neutral-color semi-transparent organic photovoltaics", *Appl. Phys. Lett.* 118, 033302 (2021)

What is claimed is:

1. An organic photovoltaic device, comprising:
a substrate including a UV stop filter positioned on a light incident side of the substrate;
a first electrode positioned over the substrate;
at least one organic heterojunction layer positioned over the first electrode;
a second electrode positioned over the organic heterojunction layer; and
a thin film stack positioned over the second electrode, comprising a plurality of sublayers of a first dielectric material alternating with a plurality of sublayers of a second dielectric material;
wherein at least one of the plurality of sublayers of the first dielectric material has a thickness that is different from another of the plurality of sublayers of the first dielectric material; and
wherein the UV stop filter comprises an $MgF_2$ sublayer between a ZnO sublayer and a $SiO_2$ sublayer.

2. The organic photovoltaic device of claim 1, wherein the organic photovoltaic device has a mean transmittance of between 10% and 100% for light between 420 nm and 670 nm, with a variance of ±10%.

3. The organic photovoltaic device of claim 1, wherein each of the sublayers of the first and second materials have different thicknesses from one another.

4. The organic photovoltaic device of claim 1, wherein the organic photovoltaic device further comprises a UV-reflective coating positioned below the first electrode, configured to reflect or absorb at least 90% of light at wavelengths less than 400 nm.

5. The organic photovoltaic device of claim 1, wherein the thin film stack is configured to reflect at least 40% of light at wavelengths between 670 nm and 2000 nm.

6. The organic photovoltaic device of claim 1, wherein the first material comprises CBP and the second material comprises $MgF_2$.

7. The organic photovoltaic device of claim 1, wherein the first and second electrodes comprise ITO.

8. The organic photovoltaic device of claim 1, wherein a contrast between indices of refraction of the first and second dielectric materials is at least 0.2.

9. The organic photovoltaic device of claim 1, wherein a contrast between indices of refraction of the first and second dielectric materials is at least 0.3.

10. The organic photovoltaic device of claim 1, wherein a contrast between indices of refraction of the first and second dielectric materials is at least 0.4.

11. The organic photovoltaic device of claim 1, wherein the thin film stack has no periodicity of layer thicknesses or indices of refraction.

12. The organic photovoltaic device of claim 1, wherein the thin film stack is configured to reflect at least 90% of light at wavelengths between 670 nm and 2000 nm.

13. An organic photovoltaic device, comprising:
a substrate including a UV stop filter positioned on a light incident side of the substrate;
a first electrode positioned over the substrate;
at least one organic heterojunction layer positioned over the first electrode;
a second electrode positioned over the organic heterojunction layer; and
a thin film stack positioned over the second electrode, comprising a plurality of sublayers of a first dielectric material alternating with a plurality of sublayers of a second dielectric material;
wherein the UV stop filter comprises an $MgF_2$ sublayer between a ZnO sublayer and a $SiO_2$ sublayer.

14. The organic photovoltaic device of claim 13, wherein each sublayer in the plurality of sublayers has a different thickness from every other sublayer of the plurality of sublayers.

15. The organic photovoltaic device of claim 13, wherein the organic photovoltaic device has a mean transmittance of between 10% and 100% for light in a first subset of a spectrum with a variance of ±10%, wherein the first subset of the spectrum is selected from red (620 nm-670 nm), green (490 nm-570 nm), or blue (440 nm-490 nm).

16. The organic photovoltaic device of claim 13, further comprising a reflector positioned between the second electrode and the thin film stack.

17. The organic photovoltaic device of claim 16, wherein the reflector is a distributed Bragg reflector (DBR).

18. The organic photovoltaic device of claim 13, wherein the thin film stack is positioned adjacent to the second electrode.

19. The organic photovoltaic device of claim 13, wherein the thin film stack comprises a material selected from $MgF_2$, CBP, $SiO_2$, TiOx, ZnS, SiN, or $Al_2O_3$.

20. The organic photovoltaic device of claim 1, wherein a contrast between an index of refraction of the first dielectric material and an index of refraction of the second dielectric material in the thin film stack is at least 0.1.

* * * * *